United States Patent
Tang et al.

(10) Patent No.: US 12,217,533 B2
(45) Date of Patent: Feb. 4, 2025

(54) DISPLAY PANEL AND DISPLAY DEVICE

(71) Applicant: Hubei Yangtze Industrial Innovation Center Of Advanced Display Co., Ltd., Wuhan (CN)

(72) Inventors: Shihao Tang, Shanghai (CN); Yang Zeng, Shanghai (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 0 days.

(21) Appl. No.: 18/050,581

(22) Filed: Oct. 28, 2022

(65) Prior Publication Data
US 2024/0037981 A1 Feb. 1, 2024

(30) Foreign Application Priority Data
Jul. 29, 2022 (CN) .......................... 202210908592.1

(51) Int. Cl.
*G06V 40/13* (2022.01)
*H01L 33/50* (2010.01)

(52) U.S. Cl.
CPC ........ *G06V 40/1318* (2022.01); *H01L 33/505* (2013.01)

(58) Field of Classification Search
CPC .................. G06V 40/1318; H01L 33/505
See application file for complete search history.

(56) References Cited

U.S. PATENT DOCUMENTS

| | | | | |
|---|---|---|---|---|
| 10,475,860 B2* | 11/2019 | Wang | .................. | H10K 50/844 |
| 10,979,546 B2* | 4/2021 | Gu | ..................... | G02F 1/133512 |
| 11,093,092 B2* | 8/2021 | Zeng | ..................... | G06F 3/0412 |
| 2016/0266695 A1* | 9/2016 | Bae | ..................... | G06V 40/1318 |
| 2018/0151641 A1* | 5/2018 | Choo | ..................... | G06F 1/1684 |
| 2020/0242319 A1* | 7/2020 | Zeng | ..................... | G06V 40/1318 |
| 2020/0292741 A1* | 9/2020 | Rhee | ..................... | G02B 5/0294 |
| 2020/0379602 A1* | 12/2020 | Zeng | ................... | G06V 40/1318 |
| 2020/0380238 A1* | 12/2020 | Zeng | ................... | G09G 3/3208 |
| 2020/0403018 A1* | 12/2020 | Hai | ................... | H01L 27/14685 |
| 2021/0151702 A1* | 5/2021 | Fan | ..................... | H10K 50/115 |

FOREIGN PATENT DOCUMENTS

| | | |
|---|---|---|
| CN | 112379794 A | 2/2021 |
| WO | 2022052686 A1 | 3/2022 |

* cited by examiner

*Primary Examiner* — Antonio Xavier
(74) *Attorney, Agent, or Firm* — CHRISTENSEN O'CONNOR JOHNSON KINDNESS PLLC

(57) ABSTRACT

Provided are a display panel and a display device. The display panel has an optical identification region and includes a first layer and a second layer. The first layer is located at a side of the second layer close to a light-exiting side of the display panel. The first layer has at least one first light-shielding region and includes at least one first light-transmitting hole. The second layer includes at least one second light-transmitting hole corresponding to the at least one first light-transmitting hole. One of the at least one first light-shielding region and one of the at least one second light-transmitting hole at least partially overlap with each other along a direction perpendicular to a plane of the display panel.

20 Claims, 19 Drawing Sheets

DISPLAY PANEL AND DISPLAY DEVICE

CROSS-REFERENCE TO RELATED APPLICATIONS

The present application claims priority to Chinese Patent Application No. 202210908592.1, filed on Jul. 29, 2022, the content of which is incorporated herein by reference in its entirety.

TECHNICAL FIELD

The present disclosure relates to the field of display technology, and particularly, to a display panel and a display device.

BACKGROUND

In recent years, with the continuous development of science and technology, more and more electronic devices with display functions have been widely used in people's daily life and work to bring great convenience to people's daily life and work, thus become indispensable tools for people. Moreover, in order to improve the user experience, in addition to displaying images by the display panel to performing display function, more and more display devices having optical identification functions, such as fingerprint identification, have appeared.

However, in the related art, when the display panel performs optical identification, there are problems that the identification area is small and its accuracy is low.

SUMMARY

In an aspect, some embodiments of the present disclosure provide a display panel. The display panel has an optical identification region and includes a first layer and a second layer. The first layer is located at a side of the second layer close to a light-exiting side of the display panel. The first layer has at least one first light-shielding region and includes at least one first light-transmitting hole. The second layer includes at least one second light-transmitting hole corresponding to the at least one first light-transmitting hole. One of the at least one first light-shielding region and one of the at least one second light-transmitting hole at least partially overlap with each other along a direction perpendicular to a plane of the display panel.

In another aspect, some embodiments of the present disclosure provide a display device including a display panel described above. The display panel has an optical identification region and includes a first layer and a second layer. The first layer is located at a side of the second layer close to a light-exiting side of the display panel. The first layer has at least one first light-shielding region and includes at least one first light-transmitting hole. The second layer includes at least one second light-transmitting hole corresponding to the at least one first light-transmitting hole. One of the at least one first light-shielding region and one of the at least one second light-transmitting hole at least partially overlap with each other along a direction perpendicular to a plane of the display panel.

BRIEF DESCRIPTION OF DRAWINGS

In order to better illustrate technical solutions in the embodiments of the present disclosure, the accompanying drawings used in the embodiments are briefly introduced as follows. It should be noted that the drawings described as follows are merely part of the embodiments of the present disclosure, and other drawings can also be acquired by those skilled in the art.

DESCRIPTION OF EMBODIMENTS

For better illustrating technical solutions of the present disclosure, embodiments of the present disclosure will be described in detail as follows with reference to the accompanying drawings.

It should be noted that, the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

It should be understood that the term "and/or" used herein is merely an association relationship describing associated objects, indicating that there can be three relationships, for example, A and/or B can indicate that three cases, i.e., A alone, A and B, B alone. In addition, the character "/" herein generally indicates that the related objects before and after the character are in an "or" relationship.

It should be understood that although the layer can be described using the terms of "first", "second", etc., in the embodiments of the present disclosure, the layer will not be limited to these terms. These terms are merely used to distinguish layers from one another. For example, without departing from the scope of the embodiments of the present disclosure, a first layer can also be referred to as a second layer, similarly, a second layer can also be referred to as a first layer.

Figure 1:
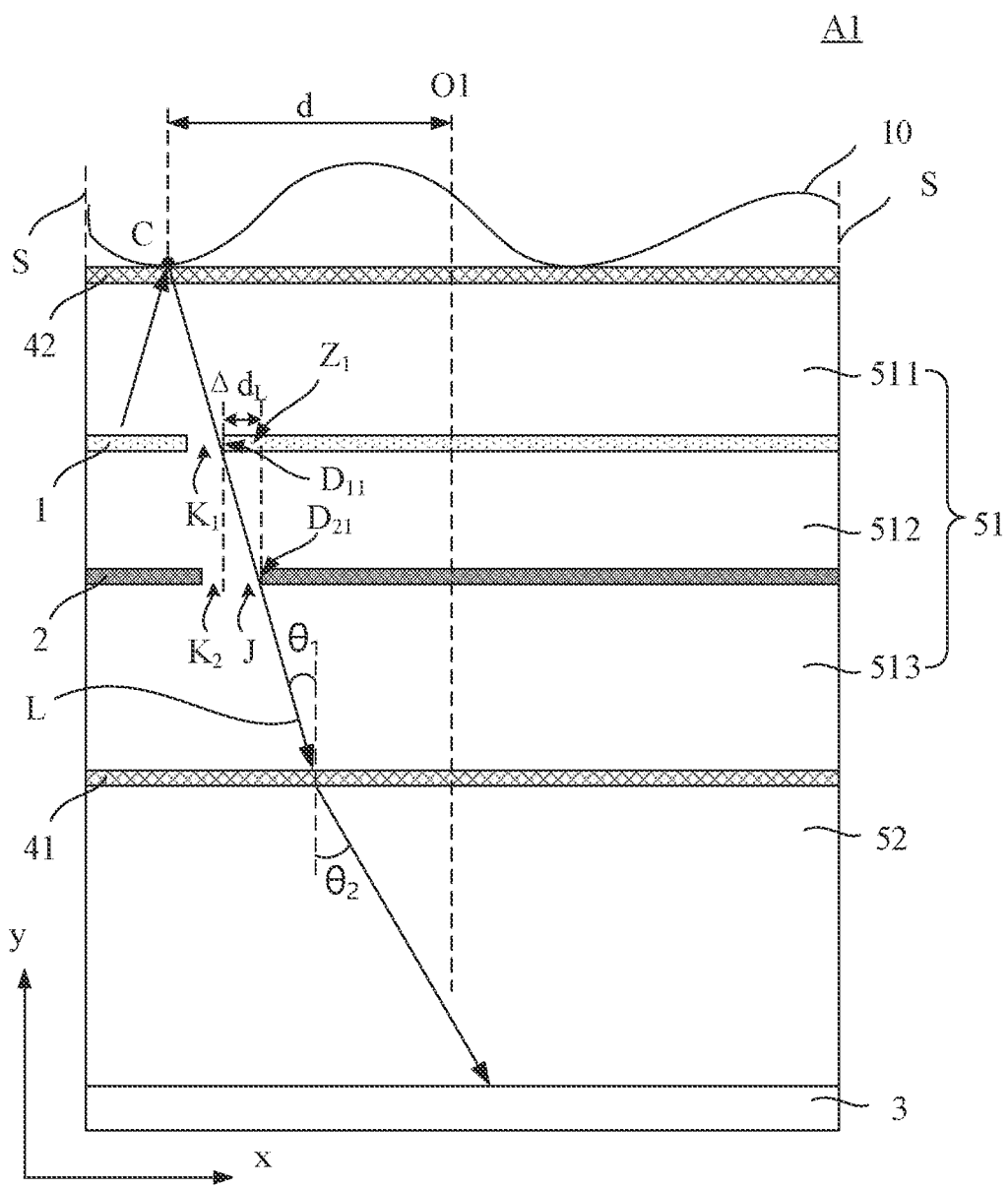
FIG. 1 is a schematic cross-sectional view of an optical identification region of a display panel according to some embodiments of the present disclosure.

Some embodiments of the present disclosure provide a display panel. The display panel includes an optical identification region A1. FIG. 1 is a schematic cross-sectional view of an optical identification region A1 of a display panel according to some embodiments of the present disclosure. As shown in FIG. 1, the display panel includes a first layer 1 and a second layer 2. The first layer 1 is located at a side of the second layer 2 close to a light-exiting side of the display panel. The first layer 1 includes at least one first light-shielding region $Z_1$ and at least one first light-transmitting hole $K_1$. The second layer 2 includes at least one second light-transmitting hole $K_2$ corresponding to the at least one first light-transmitting hole $K_1$. The second light-transmitting hole $K_2$ corresponding to the first light-transmitting hole $K_1$ means that light passing through the first light-transmitting hole $K_1$ can continue to pass through the second light-transmitting hole $K_2$. The light transmittance of the first light-transmitting hole $K_1$ and the light transmittance of the second light-transmitting hole $K_2$ are each greater than the light transmittance of the first light-shielding region $Z_1$. The first light-shielding region $Z_1$ and the second light-transmitting hole $K_2$ at least partially overlap with each other along a direction perpendicular to a plane of the display panel. As shown in FIG. 1, a portion, overlapping with the first light-shielding region $Z_1$, of the second light-transmitting hole $K_2$ is defined as an overlapping portion J.

When the display panel performs optical identification, light emitted from a light source is incident to a to-be-identified subject corresponding to the optical identification region A1, and is then reflected. The reflected light can reach an optical sensor 3 provided corresponding to the optical identification region A1 after passing through the first light-transmitting hole $K_1$ and the second light-transmitting hole $K_2$. In some embodiments of the present disclosure, sub-pixels in the display panel can serve as the light source for optical identification. In other embodiments of the present disclosure, a light source provided inside of the display panel or a light source provided outside of the display penal can also serve as the light source of the optical sensor 3 to provide an optical signal for optical identification.

The optical sensor 3 is located at a side of the second layer 2 away from the first layer 1. Then, the optical sensor 3 can identify the to-be-identified subject according to its received reflected light, thereby realizing optical identification. Taking the to-be-identified subject as a fingerprint as an example, as shown in FIG. 1, when performing finger identification, a finger 10 presses the optical identification region A1, the intensity of the light reflected by the positions in contact with the fingerprint valley and the fingerprint ridge in the optical identification region A1 are different from each other. Therefore, the optical sensor 3 then can distinguish the fingerprint alley and fingerprint ridge according to the intensity of its received reflected light, thereby realizing finger identification.

The reflected light reflected by the to-be-identified subject can have various propagation directions. For some large-angle reflected light incident to the first light-transmitting hole $K_1$ (the large-angle reflected light refers to the reflected light whose propagation direction has an angle lager than 0° relative to a direction perpendicular to the plane of the display panel), with reference to FIG. 1, the large-angle reflected light is defined as first light L. In this case, after the first light L exits from the first light-transmitting hole $K_1$, since the propagation direction of the first light L is inclined relative to the direction perpendicular to the plane of the display panel, the first light L reaches a region of the second layer 2 that overlaps with the first light-shielding region $Z_1$ along the direction perpendicular to the plane of the display panel when the first light L is incident to the second layer 2, that is, the first light L is incident to the overlapping portion J of the second layer 2. In some embodiments of the present disclosure, the second light-transmitting hole $K_2$ and the first light-shielding region $Z_1$ overlap with each other along the direction perpendicular to the plane of the display panel. Therefore, the first light L incident to the first light-transmitting hole $K_1$ located in the first layer 1 can pass through the second light-transmitting hole $K_2$ located in the second layer 2, and then continues to propagate towards the optical sensor 3 after passing through the second light-transmitting hole $K_2$.

In the display panel provided by the embodiments of the present disclosure, by forming the first light-transmitting hole $K_1$ and the second light-transmitting hole $K_2$ in the first layer 1 and the second layer 2 of the display panel respectively, the optical identification can be realized at a side of the display panel away from the light-exiting side. That is, optical identification under the screen can be achieved. The display panel adopting the above structure does not need to reserve space where a physical button is provided on a light-emitting surface, so that a full-screen design can be realized, that is, the display region of the display panel can basically cover an entire surface of the display panel.

In the embodiments of the present disclosure, by making the second light-transmitting hole $K_2$ and the first light-shielding region $Z_1$ in the first layer 1 at least partially overlap with each other along the direction perpendicular to the plane of the display panel, the large-angle reflected light that passes through the first light-transmitting hole $K_1$ can successfully propagate towards the optical sensor 3 after passing through the second light-transmitting hole $K_2$ in the second layer 2, which is beneficial to increasing the intensity of the large-angle reflected light received by the optical sensor 3, and thus improving the identification accuracy of the identification sensor 3.

Exemplarily, the above optical sensor 3 includes a device with a photosensitive function, such as a photosensitive diode. The above optical identification region A1 is defined by a sensing region of the optical sensor 3.

As shown in FIG. 1, the display panel includes a collection point C located at a touch surface. The collection point C is located in the optical identification region A1. In some embodiments of the present disclosure, the touch surface can be a surface of the display panel close to the light-exiting side. Exemplarily, the touch surface includes multiple collection points C, and all the collection points C at the touch surface together define the optical identification region A1. When performing optical identification including finger identification, the to-be-identified subject such as the finger 10 can press the optical identification region A1, and different positions of the finger 10 can press different collection points C at the touch surface. Exemplarily, the collection point C can be a virtual point, that is, the display panel does not include a physical structure forming the collection point C. The light emitted from the light source reaches the collection point C that is pressed by the to-be-identified subject in the optical identification region A1, and then the reflected light carrying the characteristic information at the corresponding position reaches the optical sensor 3. Then, the optical sensor 3 determines the characteristics of the to-be-identified subject that presses the collection point C according to the reflected light returned from each collection point C.

It should be understood that an area of the optical identification region A1 can be different from an area of the optical sensor 3. For example, an optical path of the reflected light formed at the collection point C can be designed in such a manner that the area of the optical identification region A1 is larger than the area of the optical sensor 3.

Exemplarily, there are one or more optical sensors 3. When the display panel includes multiple optical sensors 3, the multiple optical sensors 3 can be dispersedly arranged in the display panel, so that the display panel has multiple optical identification regions A1 arranged dispersedly, and each optical identification region A1 is defined by a sensing range of a respective one of the multiple optical sensors. In some embodiments, multiple optical sensors 3 can be arranged side by side at a back side of the display panel by splicing, so that the display panel has an optical identification region A1 having a larger area. In this case, the sensing regions of the multiple optical sensors 3 together define the optical identification region A1. That is, the optical identification region A1 includes multiple sub-areas, and each sub-area corresponds to a sensing region of a respective one of the multiple optical sensors 3. Exemplarily, with such configuration, the optical identification region A1 of the display panel can be extended to the entire display region, thereby realizing full-screen fingerprint detection.

Exemplarily, as shown in FIG. 1, the first light-shielding region $Z_1$ is adjacent to the first light-transmitting hole $K_1$. At least a part of the first light-shielding region $Z_1$ is located at a side of the first light-transmitting hole $K_1$ (the first light-transmitting hole $K_1$ corresponding to the second light-transmitting hole $K_2$ that corresponds to the at least the part of the first light-shielding region $Z_1$) close to a center O1 of the optical identification region A1. The center O1 of the optical identification region A1 refers to a geometric center of the optical identification region A1.

Figure 2:
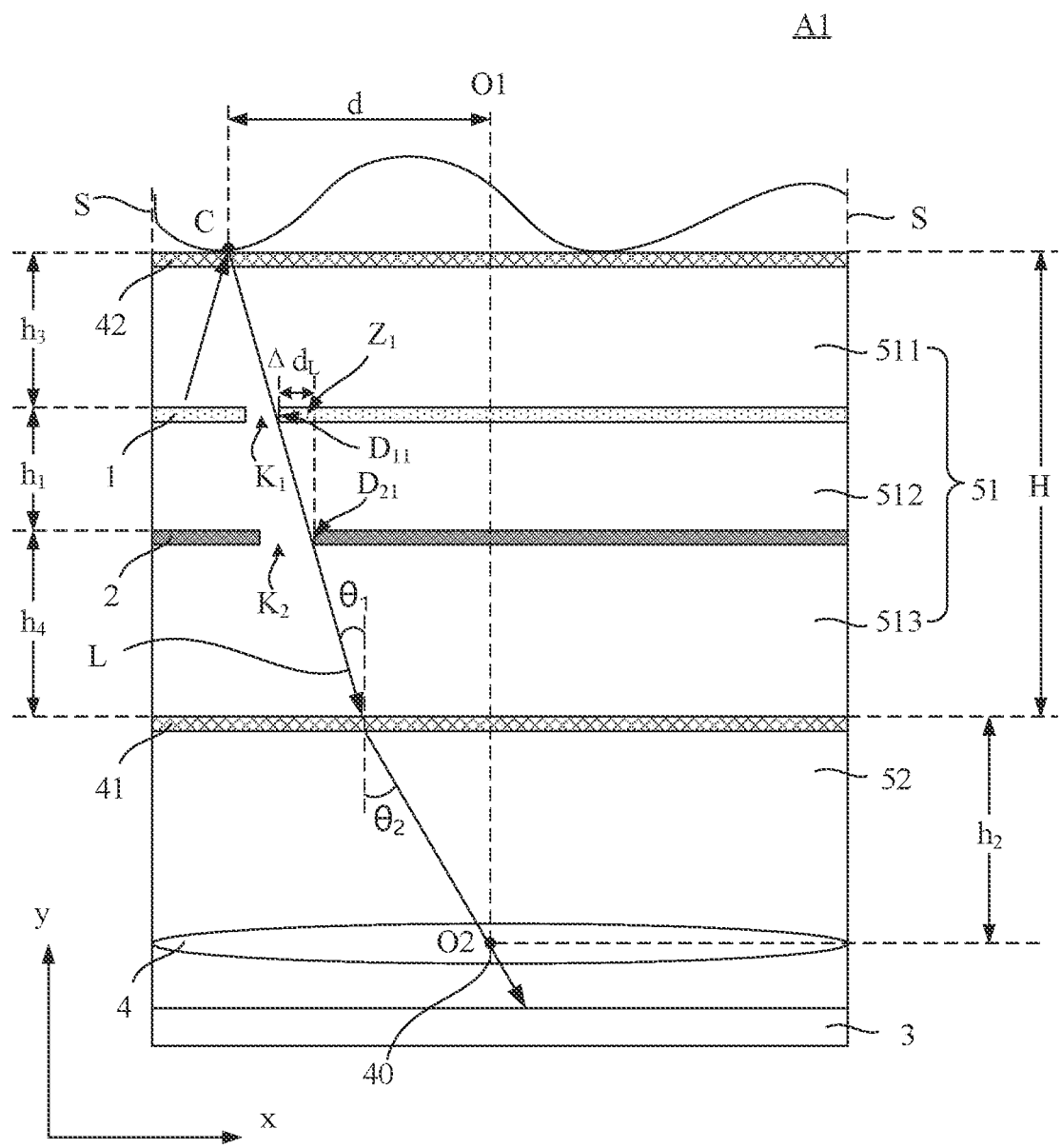
FIG. 2 is a schematic cross-sectional view of an optical identification region of another display panel according to some embodiments of the present disclosure.

FIG. 2 is a schematic cross-sectional view of an optical identification region of another display panel according to some embodiments of the present disclosure. Exemplarily, as shown in FIG. 2, the display panel includes at least one lens 4 located at a side of the second layer 2 facing away from the first layer 1. An orthographic projection of the lens 4 on the plane of the display panel is located in the optical identification region A1.

When performing optical identification, the reflected light carrying the characteristic information that is reflected by the to-be-identified subject sequentially passes through the first light-transmitting hole $K_1$ and the second light-transmitting hole $K_2$, and then continues to pass through the lens 4. The lens 4 can focus the reflected light to form an image in the optical sensor 3 with the characteristics of the to-be-identified subject, such as an image of the fingerprint. The optical sensor 3 can perform identity recognition by comparing the image of the to-be-identified image with a preset image.

Exemplarily, as shown in FIG. 2, a main optical axis 40 of the lens 4 is perpendicular to the plane of the display panel and passes through the center O1 of the optical identification region A1.

In the related art, for the large-angle reflected light whose propagation direction has a large angle relative to the main optical axis 40 of the lens 4, the large-angle reflected light will be shielded when trying to pass through the first layer 1 and the second layer 2 and thus cannot participate in imaging. Based on the configuration provided by the embodiments of the present disclosure, the first light-shielding region $Z_1$ and the second light-transmitting hole $K_2$ overlaps with each other along the direction perpendicular to the plane of the display panel, so that the large-angle reflected light can smoothly pass through the first light-transmitting hole $K_1$ and the second light-transmitting hole $K_2$, and then enter the lens 4 to participate in imaging, which is beneficial to improving the definition of the characteristic image formed in the optical sensor 3, thereby ensuring the accuracy of the optical identification.

Exemplarily, in some embodiments of the present disclosure, one or more lenses 4 can be provided in the display panel. When multiple lenses 4 are provided in the display panel, one lens 4 can correspond to a respective one optical identification region A1. That is, the reflected light formed at each collection point C located in one optical identification region A1 passes through the first light-transmitting hole $K_1$ and second light-transmitting hole $K_2$ corresponding to this first light-transmitting hole $K_1$ and then is incident to the corresponding lens 4, and the reflected light formed at the collection points C located in different optical identification regions A1 is incident to different lenses 4, respectively. In any one optical identification region A1, the first light-shielding region $Z_1$ located in the optical identification region A1 and overlapping with the second light-transmitting hole $K_2$ is located at a side of the first light-transmitting hole $K_1$ (the first light-transmitting hole $K_1$ corresponding to the second light-transmitting hole $K_2$) close to the center O1 of the optical identification region A1.

Figure 3:
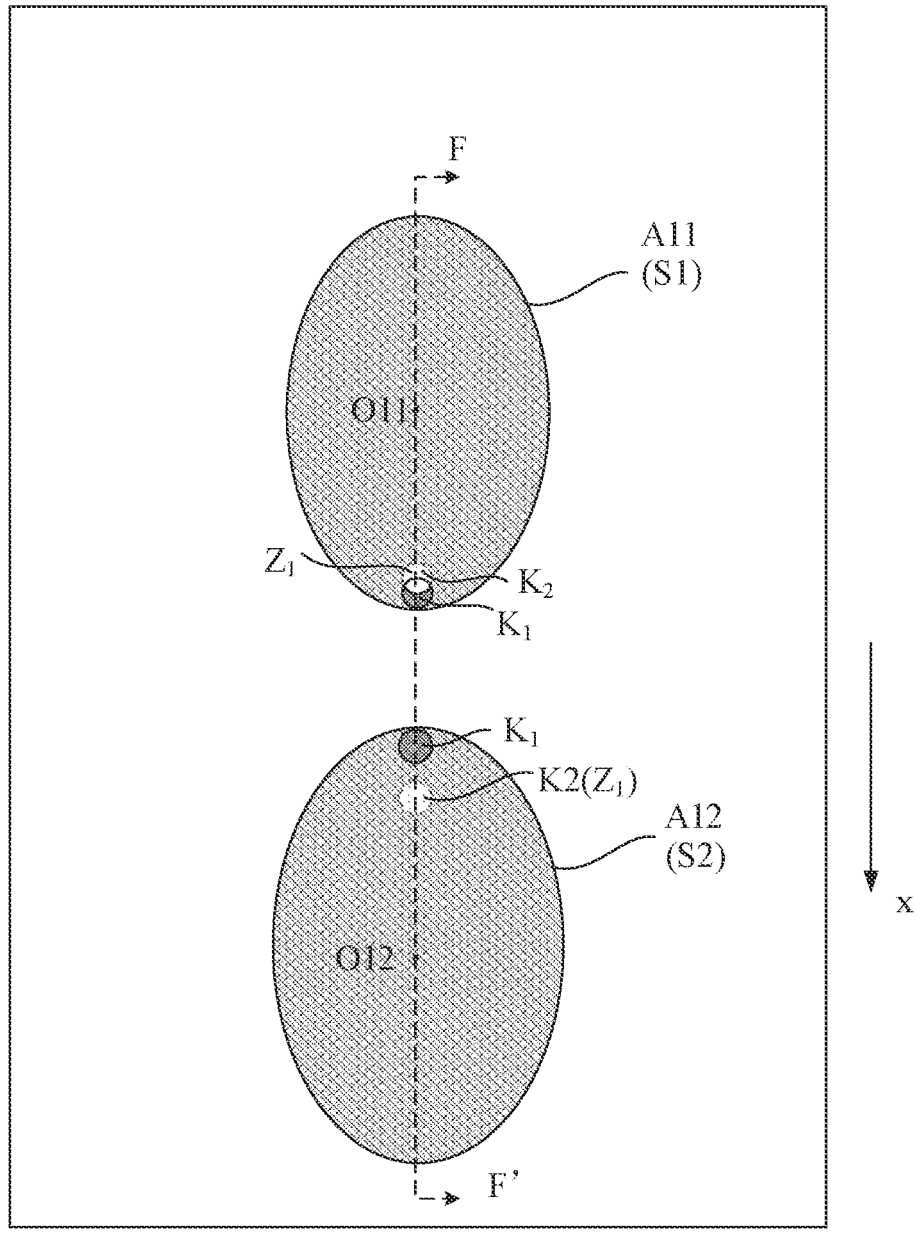
FIG. 3 is a schematic top view of a display panel according to some embodiments of the present disclosure.
Figure 4:
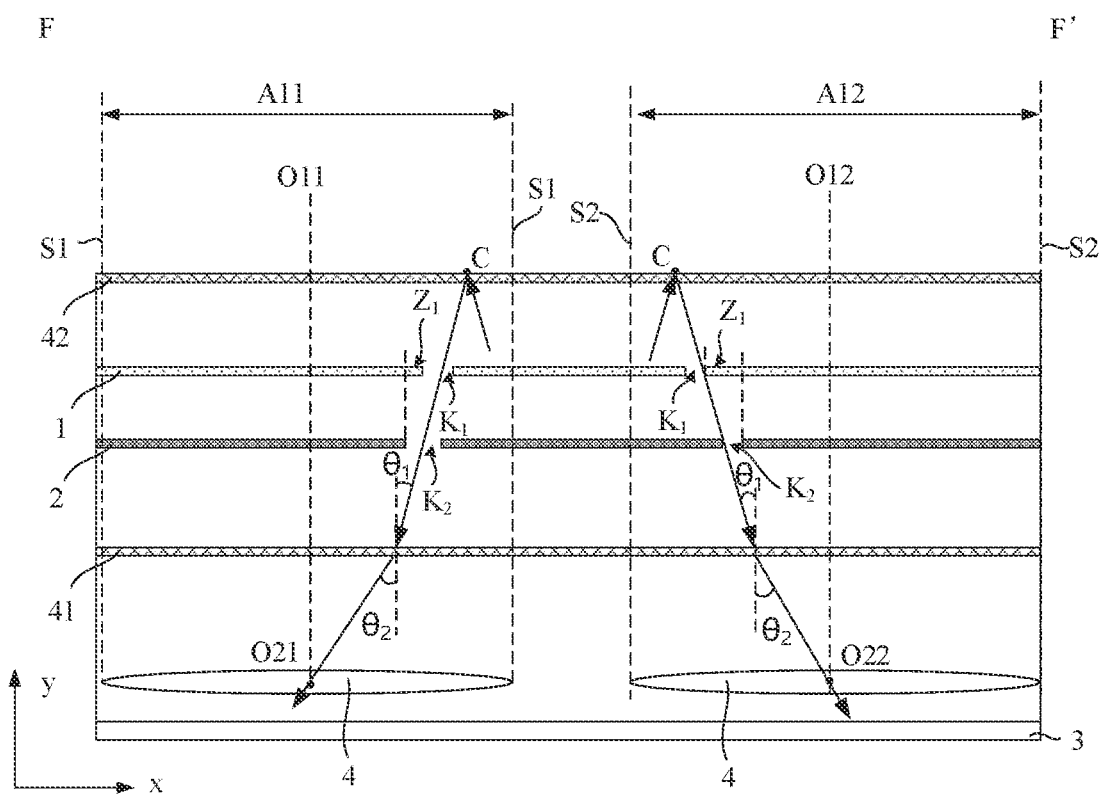
FIG. 4 is a schematic cross-sectional view along FF' shown in FIG. 3 according to some embodiments of the present disclosure.

FIG. 3 is a schematic top view of a display panel according to some embodiments of the present disclosure. FIG. 4 is a schematic cross-sectional view along FF' shown in FIG. 3. Taking the display panel including two optical identification regions A1 as an example, as shown in FIG. 3 and FIG. 4, the two optical identification regions are marked with A11 and A12, respectively.

In the optical identification region A11, the first layer 1 includes a first light-transmitting hole $K_1$ and has a first light-shielding region $Z_1$, and the second layer 2 includes a second light-transmitting hole $K_2$. Along the direction perpendicular to the plane of the display panel, the first light-shielding region $Z_1$ and the second light-transmitting hole $K_2$ overlaps with each other. The first light-shielding region $Z_1$ that overlaps with the second light-transmitting hole $K_2$ is located at a side of the first light-transmitting hole $K_1$ (the first light-transmitting hole $K_1$ corresponding to the second light-transmitting hole $K_2$) close to a center O11 of the optical identification region A11. That is, the first light-shielding region $Z_1$ is located at a side of the first light-transmitting hole $K_1$, away from an edge S1 of the optical identification region A11.

In the optical identification region A12, the first layer 1 includes a first light-transmitting hole $K_1$ and a first light-shielding region $Z_1$, and the second layer 2 includes a second light-transmitting hole $K_2$. Along the direction perpendicular to the plane of the display panel, the first light-shielding region $Z_1$ and the second light-transmitting hole $K_2$ overlap with each other. The first light-shielding region $Z_1$ that overlaps with the second light-transmitting hole $K_2$ is located at a side of the first light-transmitting hole $K_1$, (the first light-transmitting hole $K_1$ corresponding to the second light-transmitting hole $K_2$) close to a center O12 of the optical identification region A12. That is, the first light-shielding region $Z_1$ is located at a side of the first light-transmitting hole $K_1$ away from an edge S2 of the optical identification region A12.

In some embodiments of the present disclosure, as shown in FIG. 4, the optical identification region A11 and the optical identification region A12 can correspond to a same optical sensor 3.

In some embodiments of the present disclosure, as shown in FIG. 1 and FIG. 2, the first light-transmitting hole $K_1$ and the second light-transmitting hole $K_2$ at least partially overlap with each other along the direction perpendicular to the plane of the display panel. In this case, the large-angle reflected light can pass through the first light-transmitting hole $K_1$ and the corresponding second light-transmitting hole $K_2$ to reach the optical sensor 3, thereby ensuring that the optical sensor 3 can receive more reflected light formed at the corresponding collection point C in the optical identification region A1. Therefore, the definition of the identified image formed in the optical sensor 3 can be improved. The first light-transmitting hole $K_1$, the second light-transmitting hole $K_2$, and the collection point C correspond to each other, which means that the reflected light formed at the collection point C passes through the first light-transmitting hole $K_1$ and the second light-transmitting hole $K_2$.

As shown in FIG. 2, the first light-transmitting hole $K_1$ includes a first end $D_{11}$ away from an edge S of the optical identification region A1, and the second light-transmitting hole $K_2$ includes a second end $D_{21}$ away from the edge S of the optical identification region A1. For example, the first end $D_{11}$ is an end of the first light-transmitting hole $K_1$ away from the edge S closest to the first light-transmitting hole $K_1$, in the optical identification region A1, and the second end $D_{21}$ is an end of the second light-transmitting hole $K_2$ away from the edge S closest to the second light-transmitting hole $K_2$ in the optical identification region A1. Along a first direction x, a distance between the first end $D_{11}$ and the second end $D_{21}$ is $\Delta d_L$. The first direction x is parallel to the plane of the display panel. In some embodiments of the present disclosure. $\Delta d_L \geq \tan\theta_1 \times h_1$.

Herein, $\theta_1$ is an incident angle at which the first light L is irradiated on a surface of the first substrate 41 of the display panel close to the second layer 2. The first substrate 41 is located at a side of the second layer 2 facing away from the first layer 1. The first light L is reflected light formed at the collection point C and passing through the first light-transmitting hole $K_1$ and the second light-transmitting hole $K_2$. Herein, $h_1$ denotes a distance between the first light-transmitting hole $K_1$, and the second light-transmitting hole $K_2$ that correspond to the collection point C in the second direction y. The second direction y is perpendicular to the first direction x. The first light-transmitting hole $K_1$ and the second light-transmitting hole $K_2$ that correspond to the collection point C refer to that the light reflected at the collection point C passes through the first light-transmitting hole $K_1$ and the second light-transmitting hole $K_2$.

In the embodiments of the present disclosure, $\Delta d_1 \geq \tan\theta_1 \times h_1$, thus, when the first light-transmitting hole $K_1$ and the second light-transmitting hole $K_2$ at least partially overlap with each other, it can be ensured that the large-angle reflected light that is formed at the collection point C and passes through the first light-transmitting hole $K_1$ can pass through the second light-transmitting hole $K_2$ to reach the optical sensor 3. For example, at least the reflected light that is formed at the collection point C and passes through the first end $D_{11}$ of the first light-transmitting hole $K_1$ can pass through the second end $D_{21}$ of the second light-transmitting hole $K_2$, so that the intensity of the reflected light entering the optical sensor 3 corresponding to the collection point C can be guaranteed, which is beneficial to improving the accuracy and sensitivity of optical identification.

Exemplarily, the $\theta_1$ satisfies: $n_1 \sin\theta_1 = n_2 \sin\theta_2$ and $H \tan\theta_1 + h_2 \tan\theta_2 = d$. With reference to FIG. 2, $n_1$ is a refractive index of a first dielectric layer 51 in the display panel, the first dielectric layer 51 is located between a first substrate 41 and a second substrate 42, and the second substrate 42 is located at a side of the first layer 1 away from the second layer 2. A surface of the second substrate 42 away from the first layer 1 can serve as a touch surface, that is, the surface of the second substrate 42 facing away from the first layer 1 includes the collection point C.

Exemplarily, the first dielectric layer 51 can be a single-layer structure, or the first dielectric layer 51 can include multiple layers that are stacked. When the first dielectric layer 51 includes multiple layers that are stacked, $n_1$ can represent an equivalent refractive index of the multiple layers. As shown in FIG. 2, the first dielectric layer 51 includes a first dielectric sub-layer 511, a second dielectric sub-layer 512, and a third dielectric sub-layer 513. Herein, $n_1$ can represent an equivalent refractive index of the first dielectric sub-layer 511, the second dielectric sub-layer 512, and the third dielectric sub-layer 513.

Herein, $n_2$ is a refractive index of the second dielectric layer 52 in the display panel, and the second dielectric layer 52 is located between the first substrate 41 and the lens 4. Exemplarily, the second dielectric layer 52 can be a single-layer structure, or the second dielectric layer 52 can include multiple layers that are stacked. When the second dielectric layer 52 includes multiple layers that are stacked, $n_2$ can represent an equivalent refractive index of the multiple layers.

Herein, $\theta_2$ denotes a refraction angle of the first light L exiting from a surface of the first substrate 41 away from the second layer 2. Exemplarily, as shown in FIG. 2, the first light L exits from the surface of the first substrate 41 facing away from the second layer 2 and then passes through an optical center O2 of the lens 4. That is, the first light L is main light for imaging.

Herein, H is a distance between the first substrate 41 and the second substrate 42 in the second direction y. $H=h_1+h_3+h_4$, where $h_3$ denotes a distance between the second substrate 42 and the first light-transmitting hole $K_1$ in the second direction y, and $h_4$ denotes a distance between the second light-transmitting hole $K_2$ and the first substrate 41 in the second direction y.

Herein, $h_2$ denotes a distance between the first substrate 41 and the lens 4 in the second direction y.

Herein, d denotes a distance between the collection point C corresponding to the first light L and the center O1 of the optical identification region A1.

Figure 5:
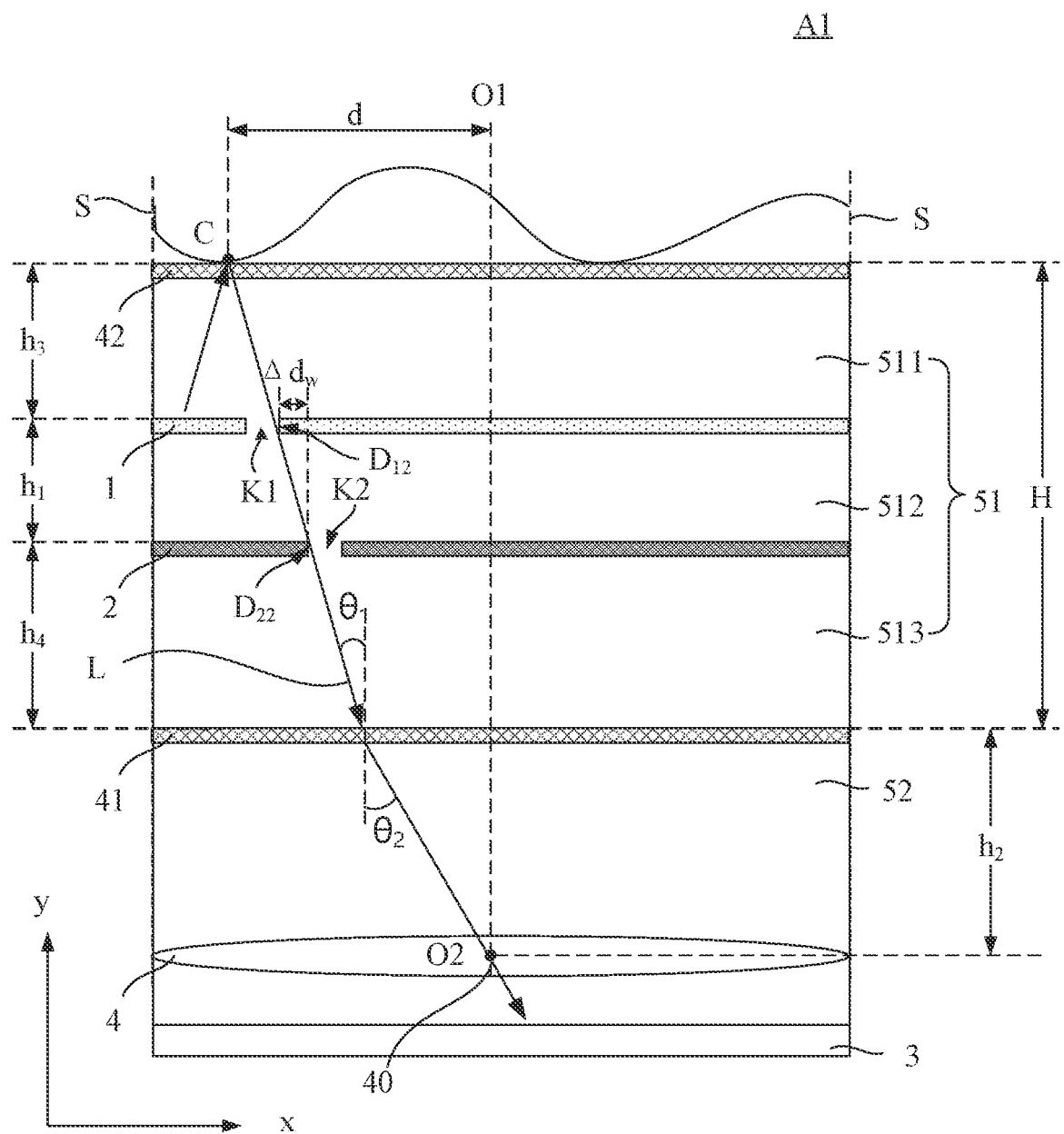
FIG. 5 is a schematic cross-sectional view of an optical identification region of another display panel according to some embodiments of the present disclosure.

FIG. 5 is a schematic cross-sectional view of an optical identification region of another display panel according to some embodiments of the present disclosure. In some embodiments of the present disclosure, as shown in FIG. 5, along the direction perpendicular to the plane of the display panel, the first light-transmitting hole $K_1$ and the second light-transmitting hole $K_2$ corresponding to this first light-transmitting hole $K_1$ do not overlap with each other, so that the large-angle reflected light that passes through the first light-transmitting hole $K_1$ can pass through the corresponding second light-transmitting hole $K_2$ to reach the optical sensor 3, thereby ensuring that the optical sensor 3 can receive more reflected light formed at the corresponding collection point C in the optical identification region A1, thus improving the definition of the identified image formed in optical sensor 3. The first light-transmitting hole $K_1$, the second light-transmitting hole $K_2$, and the collection point C correspond to each other, which means that the reflected light formed at the collection point C passes through the first light-transmitting hole $K_1$ and the second light-transmitting hole $K_2$.

In some embodiments of the present disclosure, when the display panel includes multiple optical identification regions A1, a same configuration can be applied to the first light-transmitting holes $K_1$ and the second light-transmitting holes $K_2$ located in different optical identification regions A1. For example, along the direction perpendicular to the plane of the display panel, the first light-transmitting hole $K_1$ and the second light-transmitting hole $K_2$ that correspond to each other in each optical identification region A11 at least partially overlap with each other, or the first light-transmitting hole $K_1$ and the second light-transmitting hole $K_2$ that correspond to each other in each optical identification region A11 do not overlap with each other.

In some other embodiments of the present disclosure, when the display panel includes multiple optical identification regions A1, different configurations can be applied to the first light-transmitting holes $K_1$ and the second light-transmitting holes $K_2$ located in different optical identification regions A1. For example, as shown in FIG. 3 and FIG. 4, in the optical identification region A11, the first light-transmitting hole $K_1$, and the second light-transmitting hole $K_2$ at least partially overlap with each other along the direction perpendicular to the plane of the display panel; and in the optical identification region A12, the first light-transmitting hole $K_1$ and the second light-transmitting hole $K_2$ do not overlap with each other along the direction perpendicular to the plane of the display panel.

Exemplarily, when the first light-transmitting hole $K_1$ and the second light-transmitting hole $K_2$ do not overlap with each other, as shown in FIG. 5, the first light-transmitting hole $K_1$ includes a first end $D_{12}$ away from an edge S of the optical identification region A1, and the second light-transmitting hole $K_2$ incudes a second end $D_{22}$ close to the edge S of the optical identification region A1. For example, the first end $D_{12}$ is an end of the first light-transmitting hole $K_1$ away from the edge S closest to the first light-transmitting hole $K_1$ in the optical identification region A1. The second end $D_{22}$ is an end of the second light-transmitting hole $K_2$ close to the edge S closest to the second light-transmitting hole $K_2$ in the optical identification region A1. Along the first direction x, a distance between the first end $D_{12}$ and the second end $D_{22}$ is $\Delta d_W$. The first direction x is parallel to the plane of the display panel. In some embodiments of the present disclosure, $0<\Delta d_W \leq \tan\theta_1 \times h_1$.

Herein, $\theta_1$ is an incident angle at which the first light L is irradiated on a surface of the first substrate 41 facing towards the second layer 2, and the first light L is reflected light formed at the collection point C and passing through the first light-transmitting hole $K_1$ and the second light-transmitting hole $K_2$. Herein, $h_1$ denotes a distance between the first light-transmitting hole $K_1$ and the second light-transmitting hole $K_2$ that correspond to each other in the second direction y. The second direction y is perpendicular to the first direction x.

In some embodiments of the present disclosure, $0<\Delta d_W \leq \tan\theta_1 \times h_1$, therefore, when the first light-transmitting hole $K_1$ and the second light-transmitting hole $K_2$ do not overlap with each other along the direction perpendicular to the plane of the display panel, it can ensure that the large-angle reflected light that is formed at the collection point C and passes through the first light-transmitting hole $K_1$ can pass through the second light-transmitting hole $K_2$ to reach the optical sensor 3. For example, the reflected light that is formed at the collection point C and passes through the first end $D_{12}$ of the first light-transmitting hole $K_1$ can exit at least from the second end $D_{22}$ of the second light-transmitting hole $K_2$, so as to ensure the intensity of the reflected light entering the optical sensor 3 corresponding to the collection point C, thereby being beneficial to improving the accuracy and sensitivity of the optical identification. Exemplarily, $\theta_1$ satisfies: $n_1 \sin\theta_1 = n_2 \sin\theta_2$ and $H \tan\theta_1 + h_2 \tan\theta_2 = d$, and each parameter in these formulae has a same meaning as the foregoing description and will not repeated herein.

Figure 6:
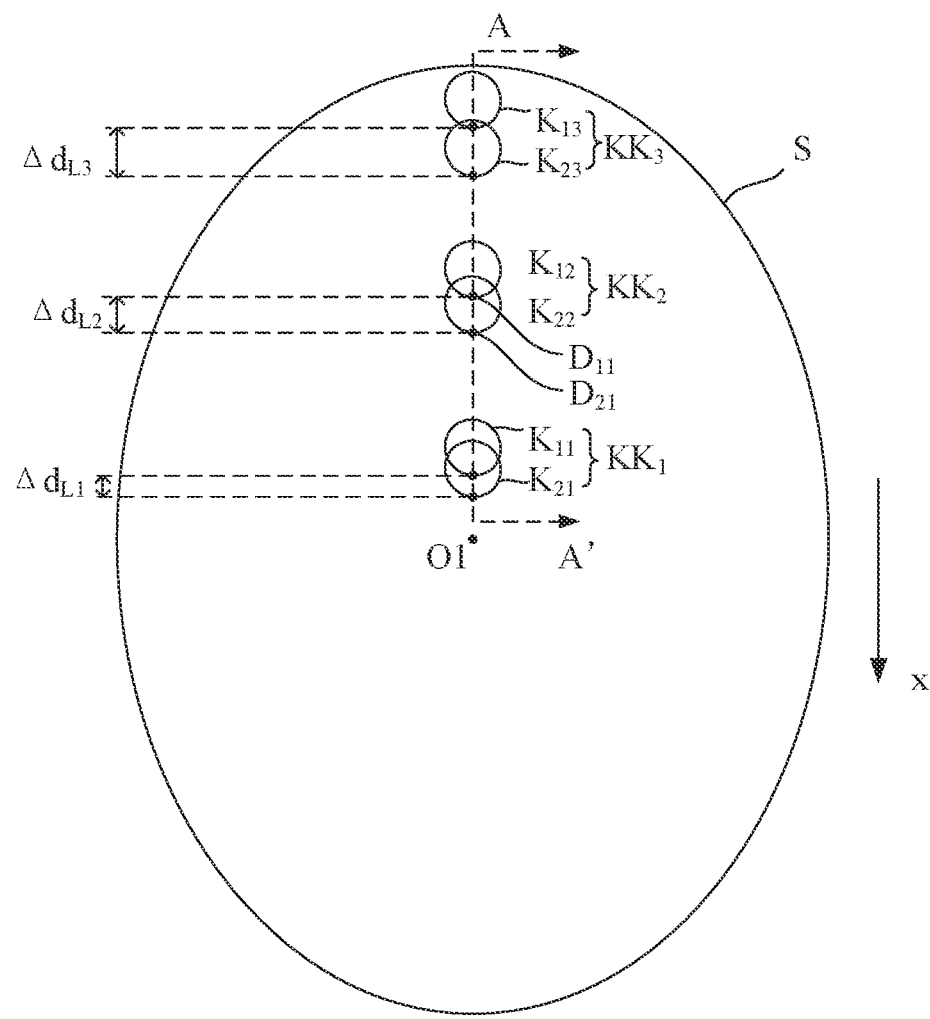
FIG. 6 is a schematic top view of an optical identification region of another display panel according to some embodiments of the present disclosure.
Figure 7:
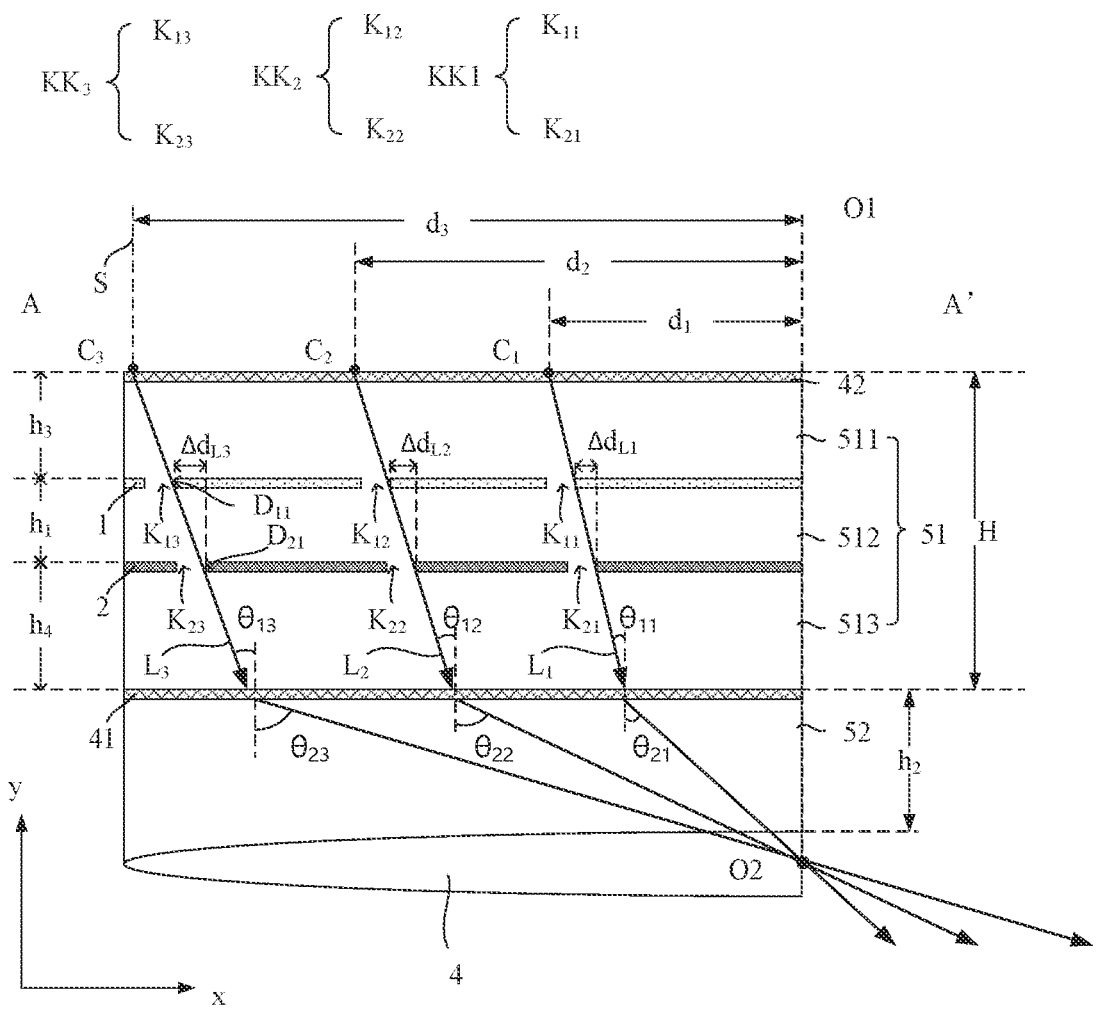
FIG. 7 is a schematic cross-sectional view along AA' shown in FIG. 6 according to some embodiments of the present disclosure.

As described above, the display panel includes multiple collection points $C_1$ to $C_n$ located at the touch surface. Along a direction from the center O of the optical identification region A1 to the edge S, a $1^{st}$ collection point $C_1$ to an $n^{th}$ collection point $C_n$ are arranged in sequence, that is, along the direction from the center O1 of the optical identification region A1 to the edge S, the $1^{st}$ collection point $C_1$ to the $n^{th}$ collection point $C_n$ have increased distances from the center O1 of the optical identification region A1. In an example, the first layer 1 includes first light-transmitting holes $K_{11}$ to $K_{1n}$ corresponding to the collection points $C_1$ to $C_n$, respectively, and the second layer 2 includes second light-transmitting holes $K_{21}$ to $K_{2n}$ corresponding to the collection points $C_1$ to $C_n$, respectively. The first light-transmitting hole $K_{1m}$ and the second light-transmitting hole $K_{2m}$ corresponding to a same collection point $C_m$ form an $m^{th}$ hole group $KK_m$, where $1 \leq m \leq n$, and n is an integer. That is, n hole groups corresponding to the collection points $C_1$ to $C_n$, respectively are provided in the optical identification region A1 of the display panel. In the following, the n hole groups are referred to as $KK_1$ to $KK_n$, respectively. Along the direction from the center O1 of the optical identification region A1 to the edge S, the $1^{st}$ hole group $KK_1$ to the $n^{th}$ hole group $KK_n$ are arranged in sequence. FIG. 6 is a schematic top view of an optical identification region A1 of a display panel according to some embodiments of the present disclosure, and FIG. 7 is a schematic cross-sectional view along AA' shown in FIG. 6. In an example, n=3, as shown in FIG. 6 and FIG. 7, a $1^{st}$ hole group $KK_1$, a $2^{nd}$ hole group $KK_2$, and a $3^{rd}$ hole group $KK_3$ are provided in the optical identification region A1 of the display panel. The $1^{st}$ hole group $KK_1$ includes a first light-transmitting hole $K_{11}$ and a second light-transmitting hole $K_{21}$, the $2^{nd}$ hole group $KK_2$ includes a first light-transmitting hole $K_{12}$ and a second light-transmitting hole $K_{22}$, and the $3^{rd}$ hole group $KK_3$ includes a first light-transmitting hole $K_{13}$ and a second light-transmitting hole $K_{23}$.

As shown in FIG. 7, the first light L includes a first reflected light $L_1$ formed at the $1^{st}$ collection point $C_1$, a second reflected light $L_2$ formed at the $2^{nd}$ collection point $C_2$, and a third reflected light $L_3$ formed at the $3^{rd}$ collection point $C_3$.

As shown in FIG. 7, the incident angles $\theta_1$ include a first incident angle $\theta_{11}$, a second incident angle $\theta_{12}$, and a third incident angle $\theta_{13}$. The first incident angle $\theta_{11}$ is an incident angle of the first reflected light $L_1$ incident to the first substrate 41, the second incident angle $\theta_{12}$ is an incident angle of the second reflected light $L_2$ incident to the first substrate 41, and the third incident angle $\theta_{13}$ is an incident angle of the third reflected light $L_3$ incident to the first substrate 41, where $\theta_{11} < \theta_{12} < \theta_{13}$.

As shown in FIG. 7, the refraction angles $\theta_2$ include a first refraction angle $\theta_{21}$, a second refraction angle $\theta_{22}$, and a third refraction angle $\theta_{23}$. The first refraction angle $\theta_{21}$ is a refraction angle of the first reflected light $L_1$ output from the first substrate 41, the second refraction angle $\theta_{22}$ is a refraction angle of the second reflected light $L_2$ output from the first substrate 41, and the third refraction angle $\theta_{23}$ is a refraction angle of the third reflected light $L_3$ output from the first substrate 41, where $\theta_{21} < \theta_{22} < \theta_{23}$.

The first reflected light $L_1$, the second reflected light $L_2$, and the third reflected light $L_3$ can all pass through an optical center O2 of the lens 4 after being output from the second layer 2.

When the first light-transmitting hole $K_1$ and the second light-transmitting hole $K_2$ in each hole group overlap with each other along the direction perpendicular to the plane of the display panel, among the n hole groups KK, along the first direction x, each first light-transmitting hole $K_1$ includes a first end $D_{11}$ away from the edge S of the optical identification region A1, and each second light-transmitting hole $K_2$ includes a second end $D_{21}$ away from the edge S of the optical identification region A1. The first direction x is parallel to the plane of the display panel.

Taking the $n^{th}$ hole group $KK_n$ as an example, in the $n^{th}$ hole group $KK_n$, along the first direction x, a distance between the first end $D_{11}$ of the first light-transmitting hole $K_{1n}$ and the second end $D_{21}$ of the second light-transmitting hole $K_{2n}$ is $\Delta d_{Ln}$, where n represents the $n^{th}$ hole group sequentially arranged along the direction from the center O1 of the optical identification region A1 to the edge S.

With reference to FIG. 6 and FIG. 7, a distance between the first end $D_{11}$ of the first light-transmitting hole $K_{11}$ in the $1^{st}$ hole group $KK_1$ and the second end $D_{21}$ of the second light-transmitting hole $K_2$, in the $1^{st}$ hole group $KK_1$ is $\Delta d_{L1}$; a distance between the first end $D_{11}$ of the first light-transmitting hole $K_{12}$ in the $2^{nd}$ hole group $KK_2$ and the second end $D_{21}$ of the second light-transmitting hole $K_{22}$ in the $2^{nd}$ hole group $KK_2$ is $\Delta d_{L2}$; and a distance between first end $D_{11}$ of the first light-transmitting hole $K_{13}$ in the $3^{rd}$ hole group $KK_3$ and the second end $D_2$, of the second transmitting hole $K_{23}$ in the $3^{rd}$ hole group $KK_3$ is $\Delta d_{L3}$.

Exemplarily, when n≥2, there are at least an integer a and an integer b between 1 and n, where a<b, that is, b≥a+1, and $\Delta d_{La} < \Delta d_{Lb}$; where $\Delta d_{La}$ is a distance between the first end $D_{11}$ of the first light-transmitting hole $K_{1a}$ in the $a^{th}$ hole group $KK_a$ and the second end $D_{21}$ of the second light-transmitting hole $K_{2a}$ in the $a^{th}$ hole group $KK_a$, the $a^{th}$ hole group $KK_a$ corresponding to the $a^{th}$ collection point $C_a$; and $\Delta d_{Lb}$ is a distance between the first end $D_{11}$ of the first light-transmitting hole $K_{1b}$ in the $b^{th}$ hole group $KK_b$ and the second end $D_{21}$ of the second light-transmitting hole $K_{2b}$ in the $b^{th}$ hole group $KK_b$, the $b^{th}$ hole group $KK_b$ corresponding to the $b^{th}$ collection point $C_b$.

Exemplarily, the $a^{th}$ collection point and the $b^{th}$ collection point can be adjacent to each other, that is, the $a^{th}$ collection point and the $b^{th}$ collection point may be two collection points that are closest to each other in the optical identification region A1 along the first direction x, that is, a+1=b.

In other embodiments, other collection point(s) can be located between the $a^{th}$ collection point and the $b^{th}$ collection point. That is, a+1<b. For example, at least a $c^{th}$ collection point and a $d^{th}$ collection point can be located between the $a^{th}$ collection point and the $b^{th}$ collection point, that is, a<c<d<b. Correspondingly, $\Delta d_{La} < \Delta d_{Lc} < \Delta d_{Ld} < \Delta d_{Lb}$. That is, along the direction from the center of the optical identification region A1 to the edge S, the distances between the first ends $D_{11}$ of the first light-transmitting holes $K_1$ and corresponding second ends $D_{21}$ of the second light-transmitting holes $K_2$ in the hole groups KK in the first direction x gradually increase. The closer to the center O1 of the optical identification region A1, the smaller the incident angle $\theta_1$ of the reflected light formed at the collection point C that can pass through the optical center O2 of the lens 4 relative to the first substrate 41. With such configuration, the distance between the first end $D_{11}$ of the first light-transmitting hole $K_1$ and the second end $D_{21}$ of the second light-transmitting hole $K_2$ in each hole group in the first direction x can be related to a location of the corresponding collection point C, which is beneficial to accurately adjusting the reflected light propagating in different directions formed at each collection point C. For example, the distance, in the first direction x, between the first end $D_{11}$ of the first light-transmitting hole $K_1$ and the second end $D_{21}$ of the second light-transmitting hole $K_2$ in the hole group corresponding to the collection point near the center of the optical identification region can be relatively small, which can not only ensure that the reflected light corresponding to the collection point successfully passes, but also reduce an influence on other structures in the display panel. With reference to FIG. 6 and FIG. 7, when n=3, and $\Delta d_{L1} < \Delta d_{L2} < \Delta d_{L3}$.

Figure 8:
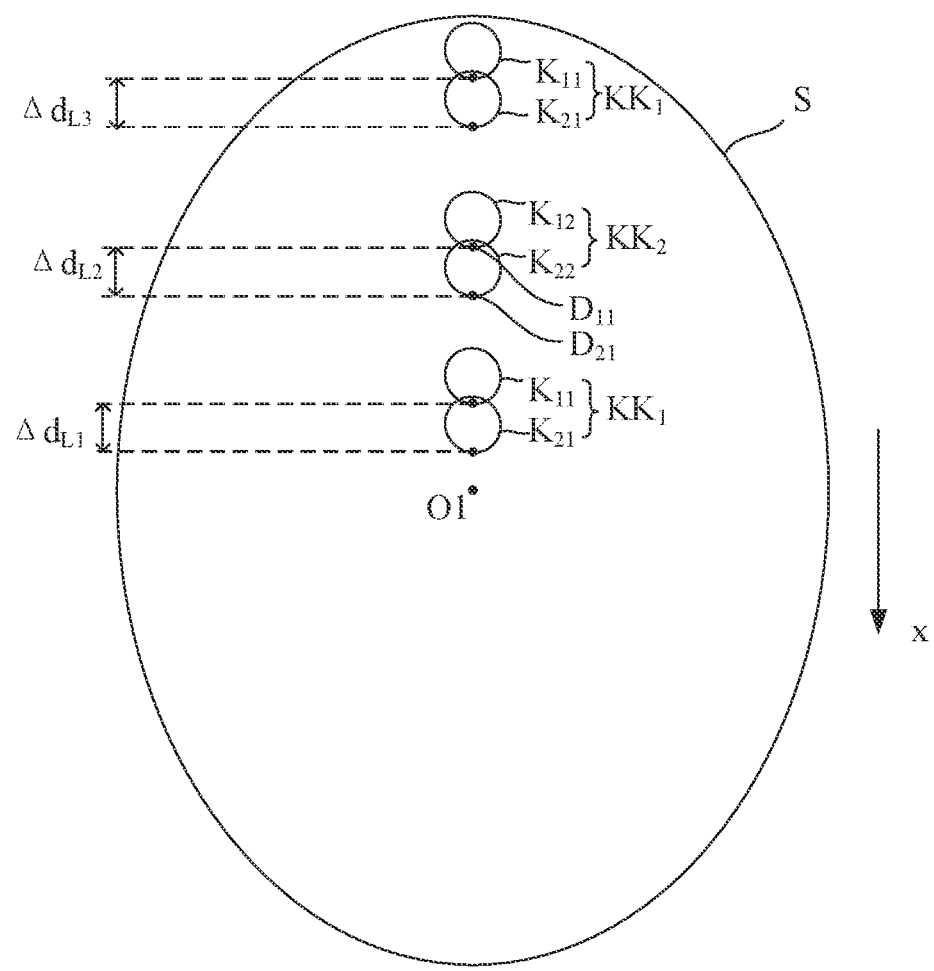
FIG. 8 is a schematic top view of an optical identification region of another display panel according to some embodiments of the present disclosure.

In some embodiments of the present disclosure, $\Delta d_{La} = \Delta d_{Lb}$, where a and b are positive integers from 1 to n, respectively, and a<b. For example, n=3, that is, the optical identification region A1 of the display panel includes three hole groups arranged along the direction from the center O1 of the optical identification region A1 to the edge S. As shown in FIG. 8, which is a schematic top view of an optical identification region A1 of another display panel according to some embodiments of the present disclosure, $\Delta d_{L1} = \Delta d_{L2} = \Delta d_{L3}$. With such configuration, it can ensure that the large-angle light reflected at each collection point can successfully pass through the corresponding hole group to reach the optical sensor 3, and at the same time, the design difficulty of the display panel can be simplified, and the structure consistency at each position in the display panel can be improved.

Exemplarily, when $\Delta d_{La}=\Delta d_{Lb}$, b=n. That is, the distance between the first end $D_{11}$ of the first light-transmitting hole $K_1$, in the $a^{th}$ hole group and the second end $D_{21}$ of the second light-transmitting hole $K_{2a}$ in the $a^{th}$ hole group, the distance between the first end $D_{11}$ of the first light-transmitting hole $K_{1b}$ in the $b^{th}$ hole group and the second end $D_{21}$ of the second light-transmitting hole $K_{2b}$ in the $b^{th}$ hole group, and the distance between the first end $D_{11}$ of the first light-transmitting hole $K_{1n}$ in the $n^{th}$ hole group and the second end $D_{21}$ of the second light-transmitting hole $K_{2n}$ in the $n^{th}$ hole group are equal to each other.

Exemplarily, n≥2, and the above a is any integer between 1 and n−1. With reference to FIG. 8, when n=3, $\Delta d_{L1}=\Delta d_{L2}=\Delta d_{L3}$.

With such configuration, it can ensure that the large-angle light reflected at each collection point can successfully pass through the corresponding hole group to reach the optical sensor 3, and at the same time, the design difficulty of the display panel can be simplified, and the structure consistency at each position in the display panel can be improved.

In some embodiments of the present disclosure, the first light-transmitting hole $K_{1n}$ and the second light-transmitting hole $K_{2n}$ in the $n^{th}$ hole group $KK_n$ at least partially overlap with each other along the direction perpendicular to the plane of the display panel, and $\Delta d_n \geq \tan\theta_1 \times h_1$, where $\theta_1$ is an incident angle at which the reflected light formed at the $n^{th}$ collection point $C_n$ is irradiated on the surface of the first substrate 41 facing towards the second layer 2, and $h_1$ is a distance between the first light-transmitting hole $K_{1n}$ in the $n^{th}$ hole group $KK_n$ and the second light-transmitting hole $K_{2n}$ in the $n^{th}$ hole group $KK_n$ in the second direction y, and the second direction y is perpendicular to the first direction x. Exemplarily, $\theta_1$ satisfies: $n_1 \sin\theta_1 = n_2 \sin\theta_2$, and H $\tan\theta_1 + h_2 \tan\theta_2 = d_n$. Herein, $d_n$ is a distance between the $n^{th}$ collection point $C_n$ corresponding to first light L and the center O1 of the optical identification region A1. The meaning of each parameter is the same as the foregoing description, and will not be repeated herein.

In the embodiments of the present disclosure, the distance $\Delta d_n$ between the first end $D_{11}$ of the first light-transmitting hole $K_{1n}$ in the $n^{th}$ hole group $KK_n$ and the second end $D_{21}$ of the second light-transmitting hole $K_{2n}$ in the $n^{th}$ hole group $KK_n$ satisfies $\Delta d_n \geq \tan\theta_1 \times h_1$, so that it can ensure that the large-angle reflected light that is formed at the $n^{th}$ collection point $C_n$ and passes through the first light-transmitting hole $K_{1n}$ can successfully pass through the second light-transmitting hole $K_{2n}$ to reach the optical sensor 3, thereby ensuring that the characteristic information collected at the $n^{th}$ collection point $C_n$ with the largest distance from the center O1 of the optical identification region A1 can be received by the optical sensor 3, and thus improving the identification accuracy and sensitivity of the optical sensor 3.

Exemplarily, the first light-transmitting hole $K_1$ and the second light-transmitting hole $K_2$ in each hole group do not overlap with each other along the direction perpendicular to the plane of the display panel, and in the n hole groups KK, along the first direction x. each first light-transmitting hole $K_1$ includes a first end $D_{12}$ away from the edge S of the optical identification region A1, and each second light-transmitting hole $K_2$ includes a second end $D_{22}$ close to the edge S of the optical identification region A1. The first direction x is parallel to the plane of the display panel.

Taking the $n^{th}$ hole group $KK_a$ as an example, in the $n^{th}$ hole group $KK_n$, along the first direction x, a distance between the first end $D_{12}$ of the first light-transmitting hole $K_1$n and the second end $D_{22}$ of the second light-transmitting hole $K_{2n}$ is $\Delta d_{Wn}$, where n represents the $n^{th}$ hole group sequentially arranged along the direction from the center O1 of the optical identification region A1 to the edge S.

Figure 9:
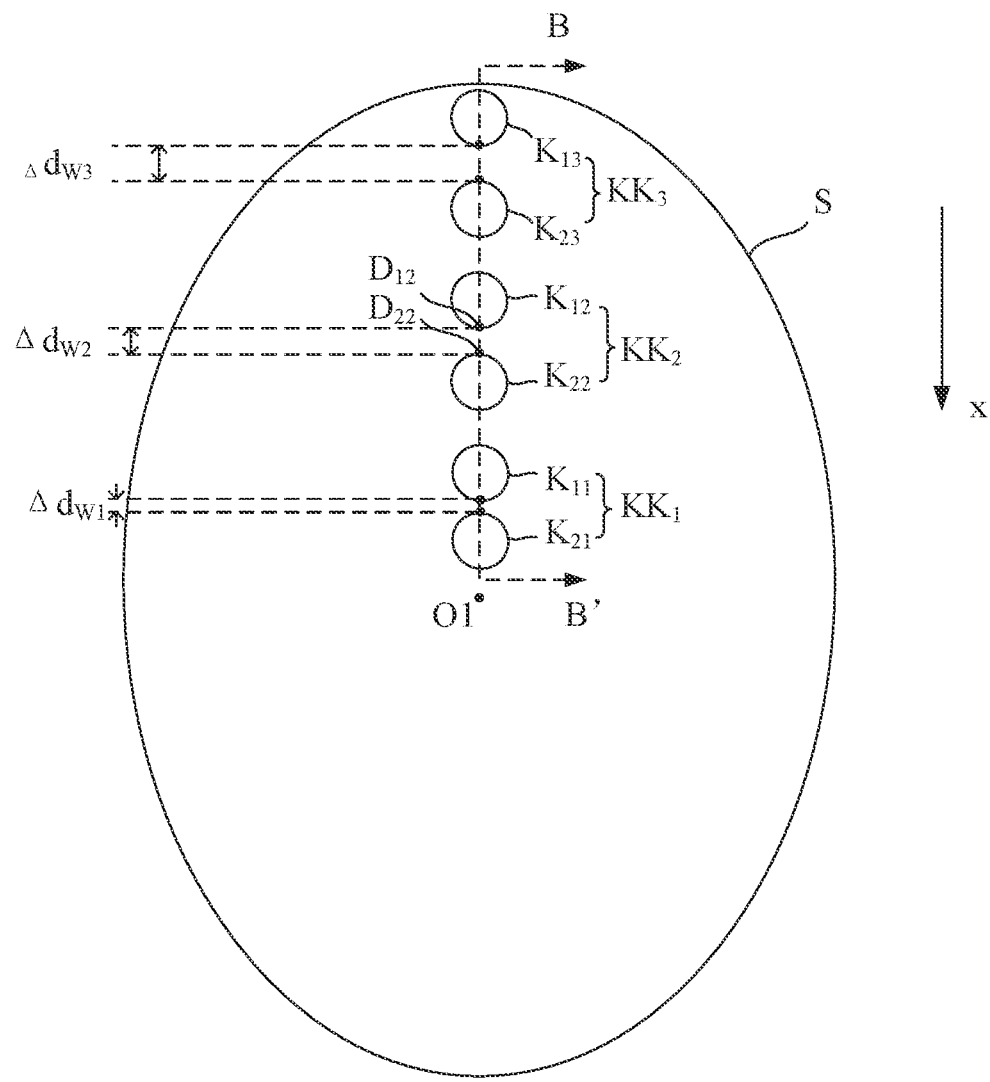
FIG. 9 is a schematic top view of an optical identification region of another display panel according to some embodiments of the present disclosure.
Figure 10:
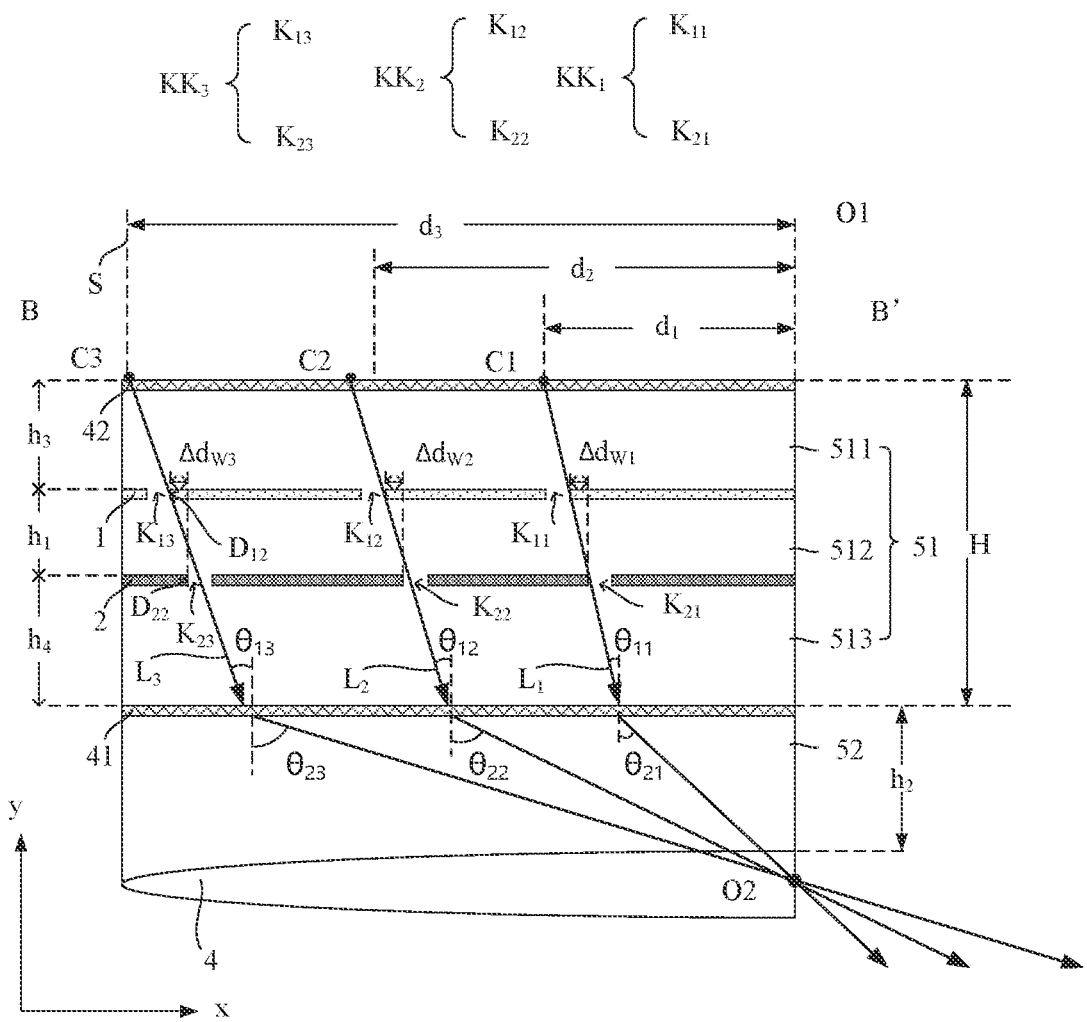
FIG. 10 is schematic cross-sectional view along BB' shown in FIG. 9 according to some embodiments of the present disclosure.
Figure 11:
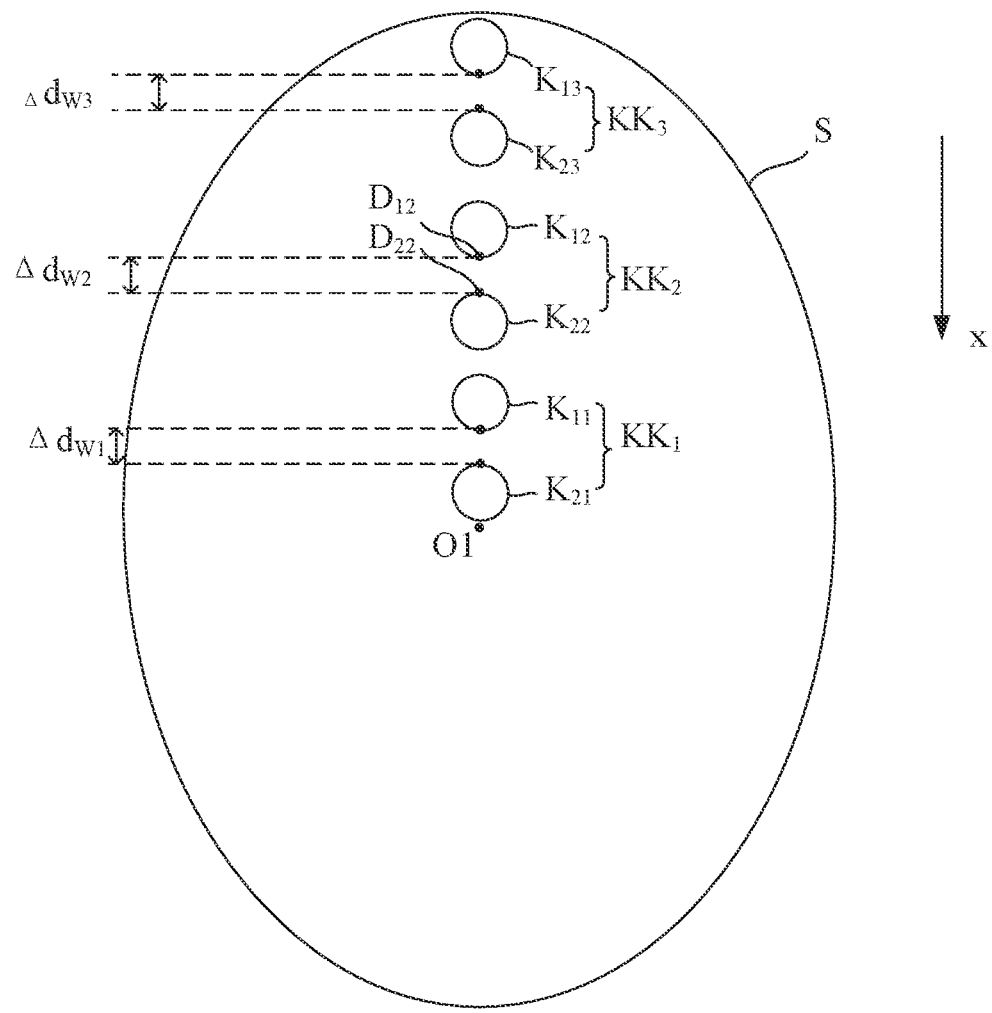
FIG. 11 is a schematic top view of an optical identification region of another display panel according to some embodiments of the present disclosure.

FIG. 9 is a schematic top view of an optical identification region of another display panel according to some embodiments of the present disclosure. FIG. 10 is schematic cross-sectional view along BB' shown in FIG. 9. With reference to FIG. 9 and FIG. 10, the distance between the first end $D_{12}$ of the first light-transmitting hole $K_{11}$ in the $1^{st}$ hole group $KK_1$ and the second end $D_{22}$ of the second light-transmitting hole $K_{21}$ in the $1^{st}$ hole group is $\Delta d_{W1}$: the distance between the first end $D_{12}$ of the first light-transmitting hole $K_{12}$ in the $2^{nd}$ hole group $KK_2$ and the second end $D_{22}$ of the second light-transmitting hole $K_{22}$ in the $2^{nd}$ hole group $KK_2$ is $\Delta d_{W2}$; and the distance between the first end $D_{12}$ of the first light-transmitting hole $K_1$; in the $3^{rd}$ hole group $KK_3$ and the second end $D_{22}$ of the second light-transmitting hole $K_{23}$ in the $3^{rd}$ hole group $KK_3$ is $\Delta d_{W3}$.

Exemplarily, when n≥2, there are at least an integer a and an integer b between 1 and n, a<b, that is, b≥a+1. And, $\Delta d_{Wa} < \Delta d_{Wb}$; where, $\Delta d_{Wa}$ is the distance between the first end $D_{12}$ of the first light-transmitting hole $K_{1a}$ in an $a^{th}$ hole group $KK_a$ and the second end $D_{22}$ of the second light-transmitting hole $K_{2a}$ in the $a^{th}$ hole group $KK_a$, the $a^{th}$ hole group $KK_a$ corresponding to an $a^{th}$ collection point $C_a$; and $\Delta d_{Wb}$ is a distance between the first end $D_{12}$ of the first light-transmitting hole $K_{1b}$ in a $b^{th}$ hole group $KK_b$ and the second end $D_{22}$ of the second light-transmitting hole $K_{2b}$ in the $b^{th}$ hole group $KK_b$, the $b^{th}$ hole group $KK_b$ corresponding to a $b^{th}$ collection point $C_b$.

Exemplarily, the $a^{th}$ collection point and the $b^{th}$ collection point can be adjacent to each other, that is, the $a^{th}$ collection point and the $b^{th}$ collection point may be two collection points that are closest to each other in the finger identification area along the first direction x, that is, a+1=b.

In some other embodiments of the present disclosure, other collection point(s) may be located between the $a^{th}$ collection point and the $b^{th}$ collection point. That is, a+1<b. For example, at least a $c^{th}$ collection point and a $d^{th}$ collection point may be located between the $a^{th}$ collection point and the $b^{th}$ collection point, and a<c<d<b. Correspondingly, $\Delta d_{Wa} < \Delta d_{Wc} < \Delta d_{Wd} < \Delta d_{Wb}$. That is, along the direction from the center O of the optical identification region A1 to the edge S, along the direction from the center of the optical identification region A1 to the edge S, the distance between the first end $D_{12}$ of the first light-transmitting hole $K_1$ and the second end $D_{22}$ of the second light-transmitting hole $K_2$ in each hole group KK in the first direction x gradually increases. The closer to the center O1 of the optical identification region A1, the smaller the incident angle $\theta_1$ of the reflected light formed at the collection point C that can pass through the optical center O2 of the lens 4. With such configuration, the distance between the first end $D_{12}$ of the first light-transmitting hole $K_1$ and the second end $D_{22}$ of the second light-transmitting hole $K_2$ in each hole group KK can be related to a location of the corresponding collection point C, which is beneficial to accurately adjusting the reflected light propagating in different directions formed at each collection point C. With reference to FIG. 9 and FIG. 10, when n=3, $\Delta d_{W1} < \Delta d_{W2} < \Delta d_{W3}$.

In some other embodiments of the present disclosure, $\Delta d_{Wa} = \Delta d_{Wb}$, where a and b are positive integers ranging from 1 to n, respectively, and a<b. For example, n=3, that is, the optical identification region A1 of the display panel includes three hole groups arranged along the direction from the center O1 of the optical identification region A1 to the edge S. FIG. 1I is a schematic top view of an optical identification region A1 of another display panel according to some embodiments of the present disclosure. With reference to FIG. 1I, $\Delta d_{W1}=\Delta d_{W2}=\Delta d_{W3}$. With such configuration, it can be ensured that the large-angle light reflected at each collection point can successfully pass through the corresponding hole group to reach the optical sensor 3, and at the same time, the design difficulty of the display panel can be simplified, and the structure consistency at each position in the display panel can be improved.

Exemplarily, when $\Delta d_{Wa}=\Delta d_{Wb}$, b=n. That is, the distance between the first end $D_{12}$ of the first light-transmitting hole $K_{1a}$ in the $a^{th}$ hole group and the second end $D_{22}$ of the second light-transmitting hole $K_{2a}$ in the $a^{th}$ hole group, the distance between the first end $D_{12}$ of the first light-transmitting hole $K_{1b}$ in the $b^{th}$ hole group and the second end $D_{22}$ of the second light-transmitting hole $K_{2b}$ in the $b^{th}$ hole group, and the distance between the first end $D_{12}$ of the first light-transmitting hole $K_{1n}$ in the $n^{th}$ hole group and the second end $D_{22}$ of the second light-transmitting hole $K_{2n}$ in the $n^{th}$ hole group are equal to each other.

Exemplarily, n≥2, and the above-mentioned a is any integer between 1 and n−1. As shown in FIG. 1I, when n=3, $\Delta d_{W1}=\Delta d_{W2}=\Delta d_{W3}$.

With such configuration, it can ensure that the large-angle light reflected at each collection point can successfully pass through the corresponding hole group to reach the optical sensor 3, and at the same time, the design difficulty of the display panel can be simplified, and the structure consistency at each position in the display panel can be improved.

In some embodiments of the present disclosure, when the first light-transmitting hole $K_{1n}$ in the $n^{th}$ hole group $KK_n$ and the second light-transmitting hole $K_{2n}$ in the $n^{th}$ hole group $KK_n$ do not overlap with each other along the direction perpendicular to the plane of the display panel, $0<\Delta d_{Wn}\leq \tan\theta_1 \times h_1$. Herein, $\theta_1$ denotes an incident angle at which the reflected light formed the $n^{th}$ collection point $C_n$ is irradiated on the surface of the first substrate 41 facing towards the second layer 2, $h_1$ denotes a distance between the first light-transmitting hole $K_{1n}$ and the second light-transmitting hole $K_{2n}$ in the $n^{th}$ hole group $KK_n$ in the second direction y. The second direction y is perpendicular to the first direction x. Exemplarily. $\theta_1$ satisfies: $n_1 \sin\theta_1 = n_2 \sin\theta_2$; and $H \tan\theta_1 + h_2 \tan\theta_2 = d_n$. Herein, $d_n$ denotes a distance between the $n^{th}$ collection point $C_n$ corresponding to the first light L and the center O1 of the optical identification region A1. Herein, the meaning of each parameter is the same as the foregoing description, and will not repeated herein.

In the embodiments of the present disclosure, the distance $\Delta d_n$ between the first end $D_{12}$ of the first light-transmitting hole $K_{1n}$ in the $n^{th}$ hole group $KK_n$ and the second end $D_{22}$ of the second light-transmitting hole $K_2n$ in the $n^{th}$ hole group $KK_n$ satisfies $0<\Delta d_{Wn}\leq \tan\theta_1 \times h_1$, so that it can ensure that the large-angle reflected light that is formed at the $n^{th}$ collection point $C_n$ and passes through the first light-transmitting hole $K_1$ can successfully pass through the second light-transmitting hole $K_{2n}$ to reach the optical sensor, thereby ensuring that the characteristic information collected at the $n^{th}$ collection point $C_n$ with the largest distance from the center O1 of the optical identification region A1 can be received by the optical sensor 3, and thus improving the identification accuracy and sensitivity of the optical sensor 3.

For each second light-transmitting hole $K_2$ in the n hole groups, the embodiments of the present disclosure provide a variety of configurations in the following.

In some embodiments of the present disclosure, the n hole groups include at least a $p^{th}$ hole group $KK_p$ and a $q^{th}$ hole group $KK_q$, where p and q are positive integers selected from 1 to n, and, p<q. An area of the second light-transmitting hole $K_{2p}$ in the $p^{th}$ hole group $KK_p$ is smaller than an area of the second light-transmitting hole $K_{2q}$ in the $q^{th}$ hole group $KK_q$. Exemplarily, p and q can be any integers selected from 1 to n, and p<q. That is, along the direction from the center O1 of the optical identification region A1 to the edge S, an area of each second light-transmitting hole $K_2$ is gradually increased, which is beneficial to accurately adjusting the reflected light propagating in different directions formed at each collection point C.

Figure 12:
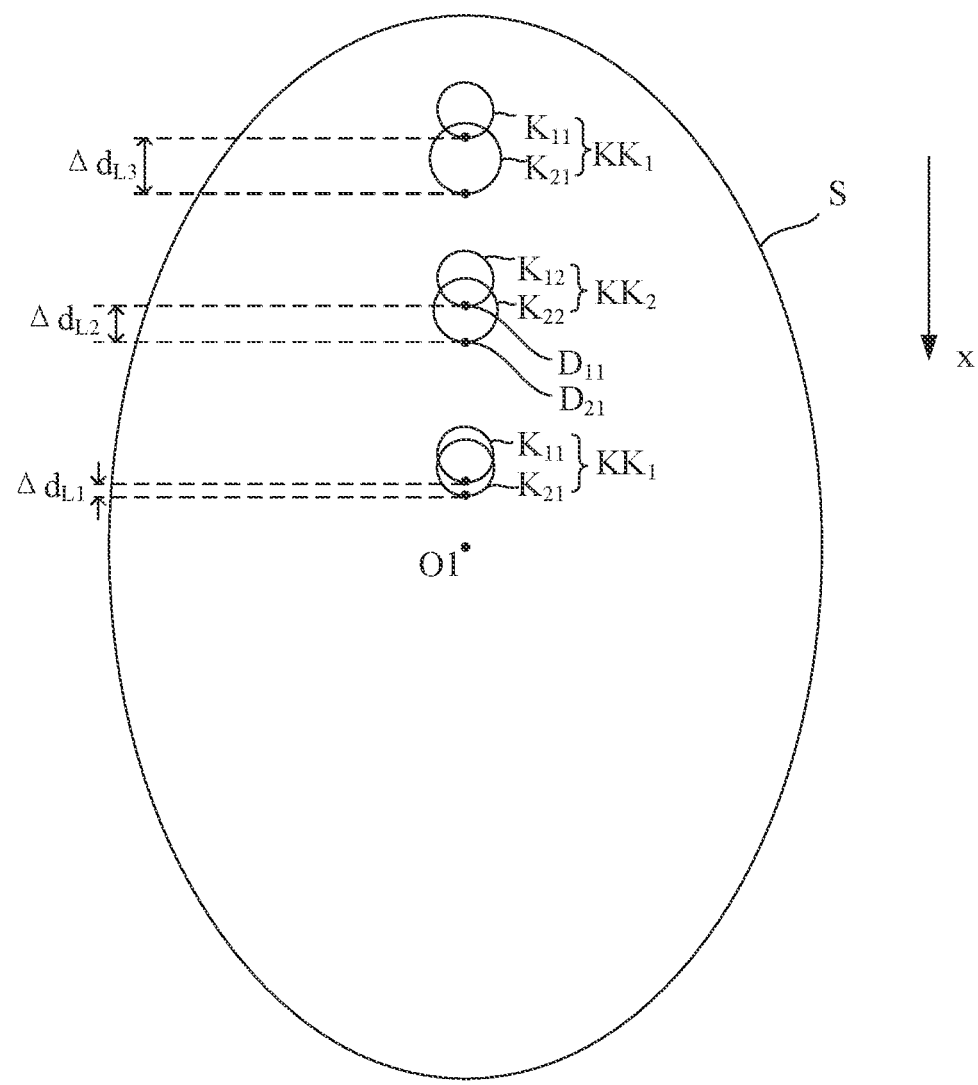
FIG. 12 is a schematic top view of an optical identification region of another display panel according to some embodiments of the present disclosure.

FIG. 12 is a schematic top view of an optical identification region of another display panel according to some embodiments of the present disclosure. In an example, n=3, as shown in FIG. 12, an area of the second light-transmitting hole $K_{21}$ is smaller than an area of the second light-transmitting hole $K_{22}$, and the area of the second light-transmitting hole $K_{22}$ is smaller than an area of the second light-transmitting hole $K_{23}$. The first light-transmitting hole and the second light-transmitting hole in a same hole group shown in FIG. 12 overlap with each other along the direction perpendicular to the plane of the display panel, and, $\Delta d_{L1}=\Delta d_{L2}=\Delta d_{L3}$ is merely illustrative. When an area of the second light-transmitting hole $K_{2p}$ in the $p^{th}$ hole group $KK_p$ is smaller than an area of the second light-transmitting hole $K_{2q}$ in the $q^{th}$ hole group $KK_q$, $\Delta d_{L1}<\Delta d_{L2}<\Delta_{L3}$. In some embodiments, the first light-transmitting hole and the second light-transmitting hole in a same hole group can not overlap with each other along the direction perpendicular to the plane of the display panel which is not limited by the embodiments of the present disclosure.

In some embodiments of the present disclosure, the n hole groups include at least an $i^{th}$ hole group and a $j^{th}$ hole group, where i and j are positive integers selected from 1 to n, and i<j. An area of the second light-transmitting hole $K_{2i}$ in the $i^{th}$ hole group $KK_1$ is equal to an area of the second light-transmitting hole $K_{2j}$ in the $j^{th}$ hole group $KK_j$. Exemplarily, i and j can be any integers selected from 1 to n, and i<j. That is, along the direction from the center O1 of the optical identification region A1 to the edge S, an area of the second light-transmitting hole $K_{2i}$ is equal to an area of the second light-transmitting hole $K_{2j}$.

Exemplarily, in some embodiments of the present disclosure, an area of the second light-transmitting hole $K_{2i}$ in the $i^{th}$ hole group $KK_1$ is equal to an area of the second light-transmitting hole $K_{2j}$ in the $j^{th}$ hole group $KK_j$, and is also equal to an area of the second light-transmitting hole $K_{2n}$ in the $n^{th}$ hole group $KK_n$. The $n^{th}$ hole group is a hole group with the closest distance to the edge of the optical identification region among the above-mentioned n hole groups, where n>j. With such configuration, it can be ensured that the large-angle reflected light formed at each collection point C can successfully pass through each hole group KK to reach the optical sensor, and at the same time, a same process can be used to form each second light-transmitting hole $K_2$ in the second layer 2, which is beneficial to simplifying the process for forming the display panel. It is also beneficial to making the environments at the positions of different second light-transmitting holes in the second layer 2 tend to be consistent, which is beneficial to improving the display uniformity. As shown in FIG. 6, for each hole group, all the second light-transmitting holes $K_2$ have a same area.

In some embodiments, as shown in FIG. 6, FIG. 8, FIG. 9, and FIC. 11, the first light-transmitting hole $K_1$ and the second light-transmitting hole $K_2$ in a same hole group KK have a same area, the first light-transmitting holes $K_1$ in different hole groups KK have a same area, and the second light-transmitting holes $K_2$ in different hole groups KK have a same area. In some embodiments of the present disclosure, on the basis of satisfying the foregoing descriptions about $\Delta d_L$ and $\Delta d_W$, the first light-transmitting hole $K_1$, and the second light-transmitting hole $K_2$ in a same hole group KK can have different areas, and/or the first light-transmitting holes $K_1$ in different hole groups KK have different areas, and/or the second light-transmitting holes $K_2$ in different hole groups KK have different areas. The embodiments of the present disclosure can be adjusted according to different design requirements, which are not limited in the embodiments of the present disclosure.

Figure 13:
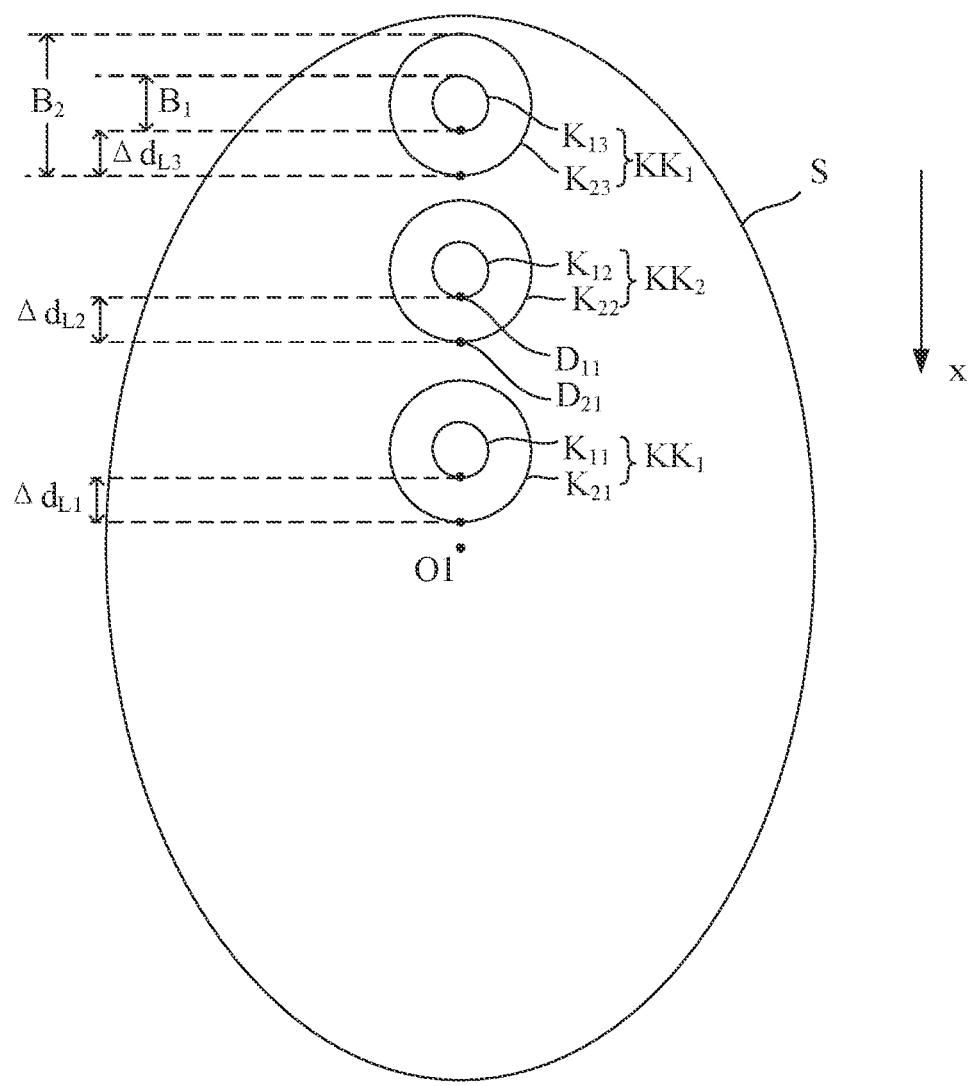
FIG. 13 is a schematic top view of an optical identification region of another display panel according to some embodiments of the present disclosure.

In some embodiments of the present disclosure, when the first light-transmitting hole $K_1$ and the second light-transmitting hole $K_2$ in a same hole group KK overlap with each other along the direction perpendicular to the plane of the display panel, for at least one hole group of the hole groups KK, an orthographic projection of the center of the first light-transmitting hole $K_1$ on the plane of the display panel coincides with an orthographic projection of the center of the second light-transmitting hole $K_2$ on the plane of the display panel. FIG. 13 is a schematic top view of an optical identification region A1 of another display panel according to some embodiments of the present disclosure. As shown in FIG. 13, in an example, an orthographic projection of the center of the first light-transmitting hole $K_1$ on the plane of the display panel coincides with an orthographic projection of the center of the second light-transmitting hole $K_2$ on the plane of the display panel. With such configuration, it can be ensured that the large-angle reflected light formed at the corresponding collection point C can pass through the first light-transmitting hole $K_1$ and the second light-transmitting hole $K_2$ to exit therefrom, and at the same time, it is beneficial to improving the consistency of the amount of light at two sides of the center of the hole group KK, thereby improving the optical identification effect.

As shown in FIG. 13, along the first direction x, a length $B_1$ of the first light-transmitting hole $K_1$ and a length $B_2$ of the second light-transmitting hole $K_2$ satisfy $(B_2-B_1)/2=\Delta d_L$.

It should be understood that, as shown in FIG. 13, it is only an example for all the hole groups KK, the first end $D_n$ of the first light-transmitting hole $K_1$ has a same distance $\Delta d_L$ from the second end $D_{21}$ of the second light-transmitting hole $K_2$. For at least one hole group of the hole groups KK, an orthographic projection of the center of the first light-transmitting hole $K_1$ on the plane of the display panel coincides with an orthographic projection of the center of the second light-transmitting hole $K_2$ on the plane of the display panel. In this case, in some embodiments of the present disclosure, the respective distances $\Delta d_L$ corresponding to different hole groups KK can be configured differentially with reference to the configuration described above. For example, along the direction from the center O1 of the optical identification region A1 to the edge S, a difference between the length $B_1$ of the first light-transmitting hole $K_1$ and the length $B_2$ of the second light-transmitting hole $K_2$ is different for each of the hole groups KK arranged in sequence, so that the distance $\Delta d_L$ corresponding to each of the hole groups KK arranged in sequence increases. That is, $\Delta d_{L1}<\Delta d_{L2}<\ldots<\Delta d_{Ln}$. Herein, $\Delta d_{L1}$ is a distance between the first end $D_{11}$ of the first light-transmitting hole $K_1$ in the $1^{st}$ hole group KK and the second end $D_{21}$ of the second light-transmitting hole $K_2$ in the $1^{st}$ hole group KK along the direction from the center O1 of the optical identification region A1 to the edge S; $\Delta d_{L2}$ is a distance between the first end $D_{11}$ of the first light-transmitting hole $K_1$ in the $2^{nd}$ hole group KK and the second end $D_{21}$ of the second light-transmitting hole $K_2$ in the $2^{nd}$ hole group KK along the direction from the center O1 of the optical identification region A1 to the edge S; and $\Delta d_{Ln}$ is a distance between the first end $D_{11}$ of the first light-transmitting hole $K_1$ in the $n^{th}$ hole group KK and the second end $D_{21}$ of the second light-transmitting hole $K_2$ in the $n^{th}$ hole group KK along the direction from the center O1 of the optical identification region A1 to the edge S.

Figure 14:
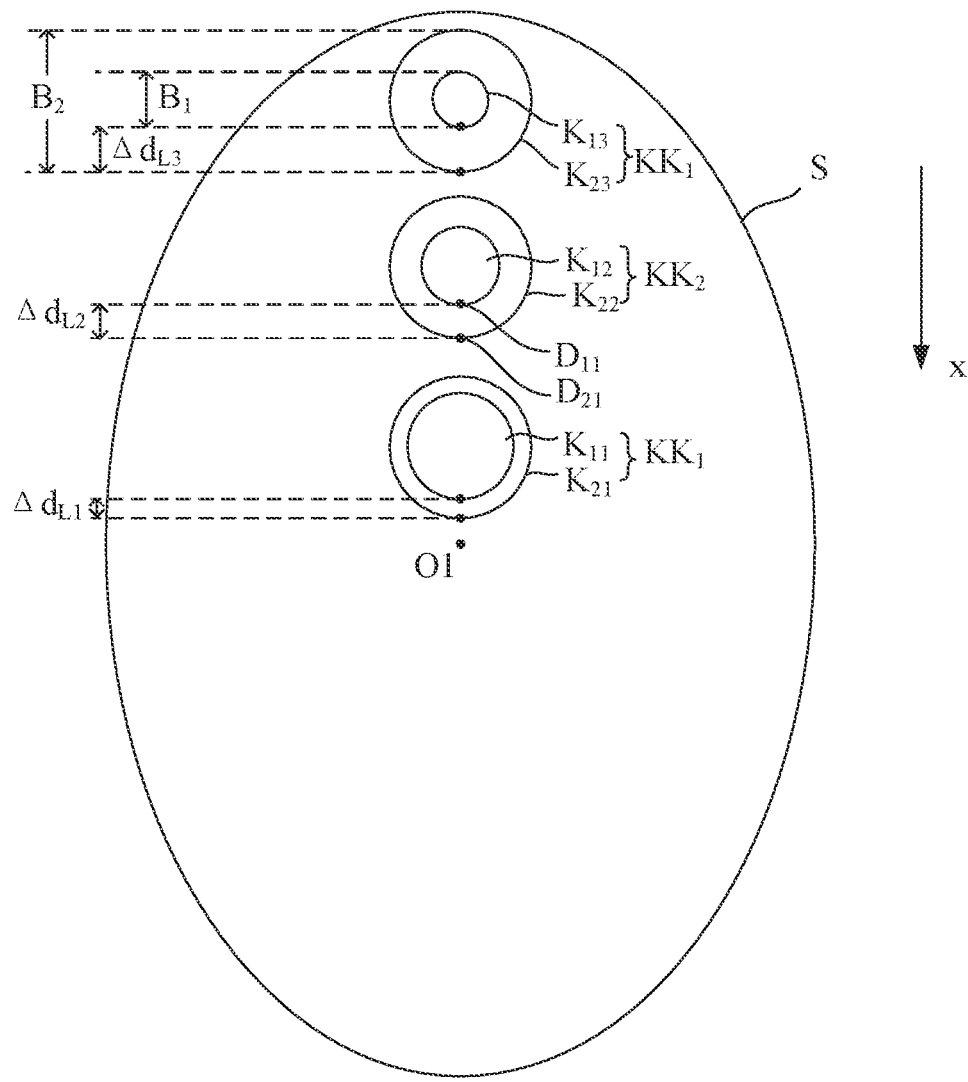
FIG. 14 is a schematic top view of an optical identification region of another display panel according to some embodiments of the present disclosure.

FIG. 14 is a schematic top view of an optical identification region of another display panel according to some embodiments of the present disclosure. As shown in FIG. 14, taking n=3 as an example, for each of the three (n=3) hole groups KK, an orthographic projection of the center of the first light-transmitting hole $K_1$ on the plane of the display panel coincides with an orthographic projection of the center of the second light-transmitting hole $K_2$ on the plane of the display panel, $\Delta d_{L1}<\Delta d_{L2}<\Delta d_{L3}$.

Figure 15:
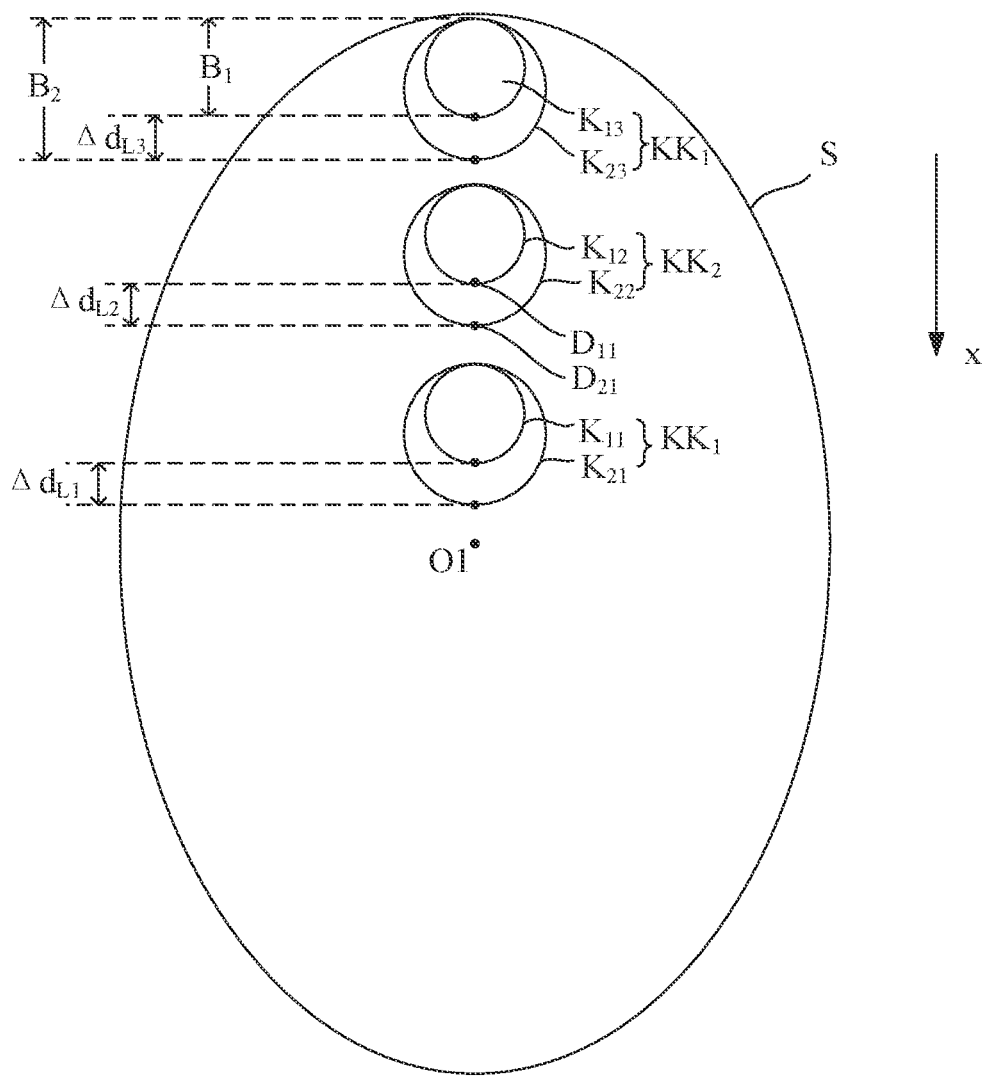
FIG. 15 is a schematic top view of an optical identification region of another display panel according to some embodiments of the present disclosure.
Figure 16:
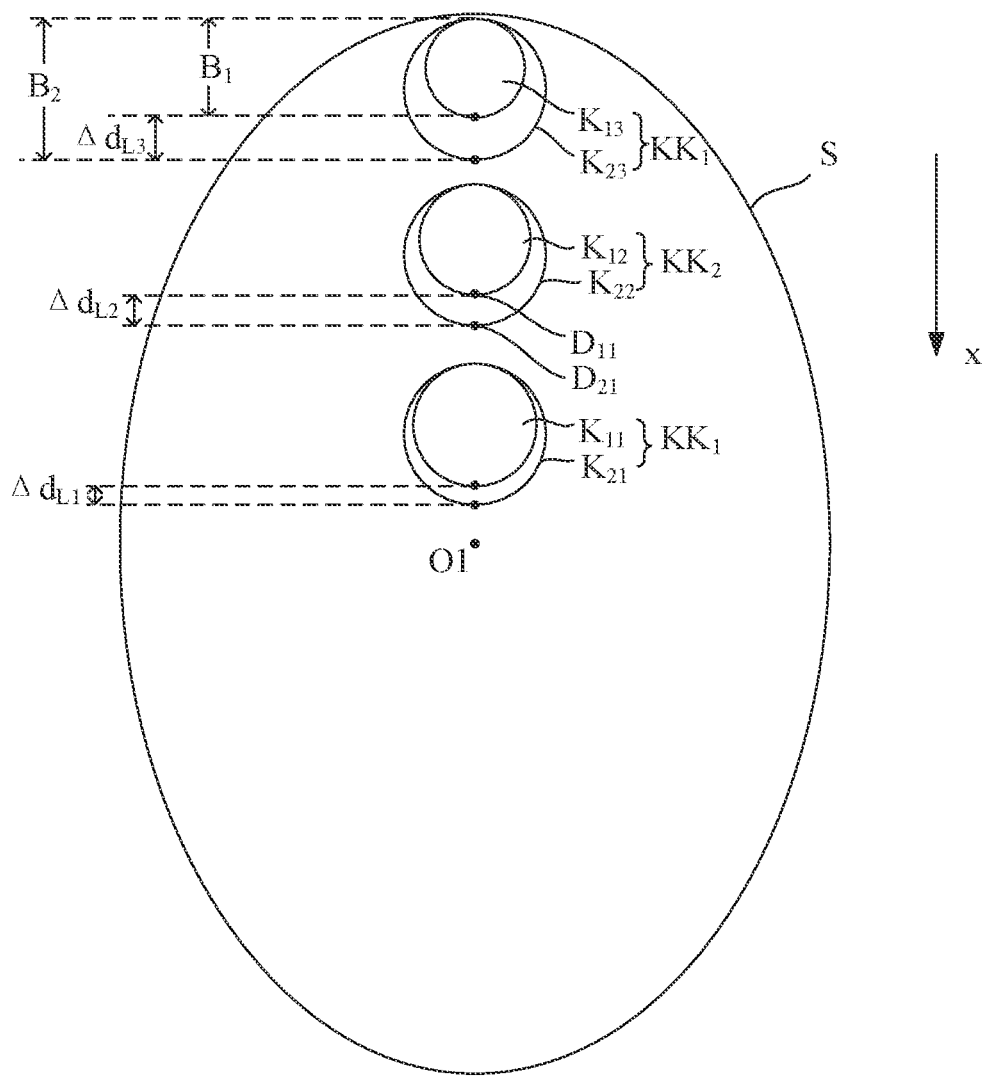
FIG. 16 is a schematic top view of an optical identification region of another display panel according to some embodiments of the present disclosure.

FIG. 15 is a schematic top view of an optical identification region of another display panel according to some embodiments of the present disclosure. In some embodiments of the present disclosure, as shown in FIG. 15, for at least one hole group of the hole groups KK, along the direction perpendicular to the plane of the display panel, an orthographic projection of a portion of the edge of the first light-transmitting hole $K_1$ on the plane of the display panel coincides with an orthographic projection of a portion of the edge of the second light-transmitting hole $K_2$ on the plane of the display panel. Exemplarily, as shown in FIG. 15, for a same hole group, the portion of the edge of the first light-transmitting hole $K_1$ and the portion of the edge of the second light-transmitting hole $K_2$ that coincide with each other are located at a side of the hole group KK close to the edge S of the optical identification region A1.

As shown in FIG. 15, along the first direction x, the length $B_1$ of the first light-transmitting hole $K_1$ and the length $B_2$ of the second light-transmitting hole $K_2$ satisfy: $B_2-B_1=\Delta d_L$.

Under a premise that the configuration of $\Delta d_L$ can satisfy the condition that the large-angle light reflected at the corresponding collection point can successfully pass through the edge of the first light-transmitting hole $K_1$ and the second light-transmitting hole $K_2$, in some embodiments of the present disclosure, an orthographic projection of a portion of the edge of the first light-transmitting hole $K_1$ on the plane of the display panel coincides with an orthographic projection of a portion of the edge of the second light-transmitting hole $K_2$ on the plane of the display panel for at least one hole group of the hole groups, so that an area of the first light-transmitting hole $K_1$ and an area of the second light-transmitting hole $K_2$ in each of the at least one hole group can be smaller, which is beneficial to reducing an influence of the first light-transmitting hole $K_1$ and the second light-transmitting hole $K_2$ on other structures in the display panel.

In FIG. 15, it is only an example that the distances $\Delta d_L$ between the first ends $D_{11}$ of the first light-transmitting holes $K_1$ and the second ends $D_{21}$ of the second light-transmitting holes $K_2$ in the hole groups KK are the same. When an orthographic projection of a portion of the edge of the first light-transmitting hole $K_1$ on the plane of the display panel coincides with an orthographic projection of a portion of the edge of the second light-transmitting hole $K_2$ on the plane of the display panel for at least one hole group of the hole groups, in some embodiments of the present disclosure, the respective distances $\Delta d_L$ corresponding to different hole groups KK can be configured differentially with reference to the configuration described above. For example, along the direction from the center O1 of the optical identification region A1 to the edge S, a difference between the length $B_1$ of the first light-transmitting hole $K_1$ and the length $B_2$ of the second light-transmitting hole $K_2$ is different for each of the hole groups KK arranged in sequence, so that the distance $\Delta d_L$ corresponding to each of the hole groups KK arranged in sequence increases. That is, $\Delta d_L < \Delta d_{L2} < \ldots < \Delta d_{Ln}$. Herein, $\Delta d_{L1}$ denotes a distance between the first end $D_{11}$ of the first light-transmitting hole $K_1$ in the $1^{st}$ hole group KK and the second end $D_{21}$ of the second light-transmitting hole $K_2$ in the $1^{st}$ hole group KK along the direction from the center O1 of the optical identification region A1 to the edge S; $\Delta d_{L2}$ denotes a distance between the first end $D_{11}$ of the first light-transmitting hole $K_1$ in the $2^{nd}$ hole group KK and the second end $D_{21}$ of the second light-transmitting hole $K_2$ in the $2^{nd}$ hole group KK along the direction from the center O1 of the optical identification region A1 to the edge S; and $\Delta d_{Ln}$ denotes a distance between the first end $D_{11}$ of the first light-transmitting hole $K_1$ in the $n^{th}$ hole group KK and the second end $D_{21}$ of the second light-transmitting hole $K_2$ in the $n^{th}$ hole group KK along the direction from the center O1 of the optical identification region A1 to the edge S.

Figure 17:
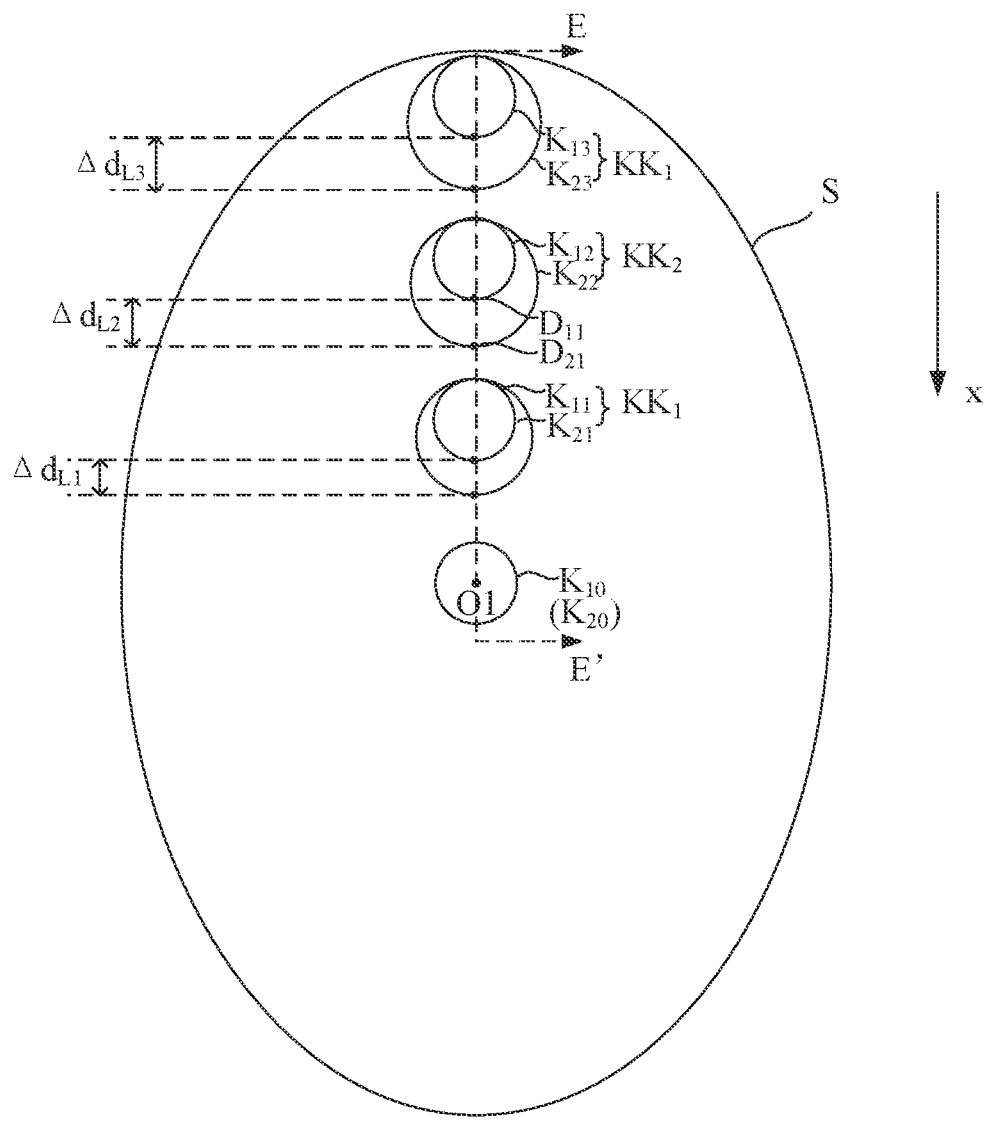
FIG. 17 is a schematic top view of an optical identification region of another display panel according to some embodiments of the present disclosure.
Figure 18:
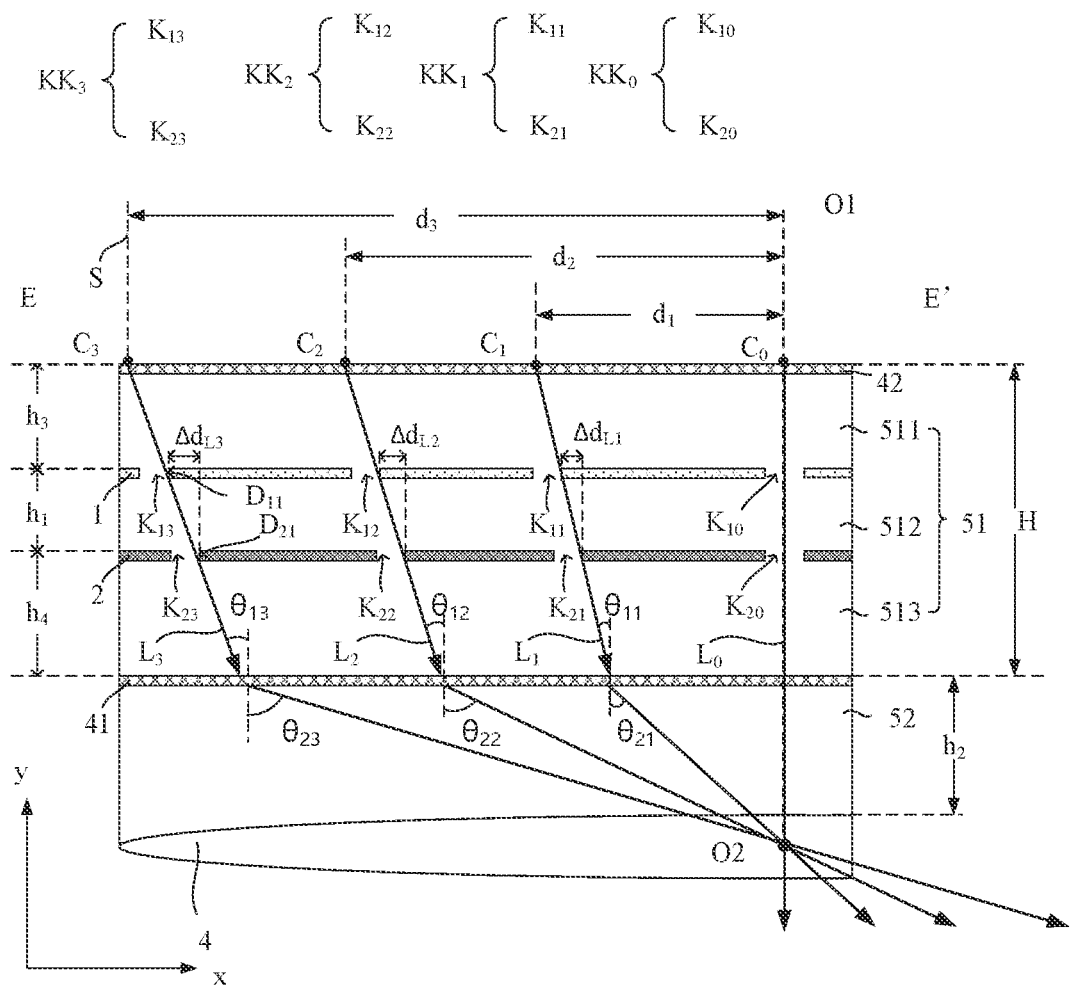
FIG. 18 is a schematic cross-sectional view along EE' shown in FIG. 17 according to some embodiments of the present disclosure.

FIG. 18 is a schematic cross-sectional view along EE' shown in FIG. 17. As shown in FIG. 18, taking n=3 as an example, for each of the three (n=3) hole groups KK, an orthographic projection of a portion of the edge of the first light-transmitting hole $K_1$ on the plane of the display panel coincides with an orthographic projection of a portion of the edge of the second light-transmitting hole $K_2$ on the plane of the display panel, $\Delta d^{L1} < \Delta d_{L2} < \Delta d_{L23}$.

As shown in FIG. 6, in some embodiments of the present disclosure, for at least one hole group of the hole groups KK, an orthographic projection of the edge of the first light-transmitting hole $K_1$ on the plane of the display panel and an orthographic projection of the edge of the second light-transmitting hole $K_2$ on the plane of the display panel may be staggered from each other, and an orthographic projection of the center of the first light-transmitting hole $K_1$ on the plane of the display panel and an orthographic projection of the center of the second light-transmitting hole $K_2$ on the plane of the display panel may be staggered from each other.

Exemplarily, as shown in FIG. 7 and FIG. 10, along the direction perpendicular to the plane of the display panel, the center O1 of the optical identification region A1 is staggered from the above-mentioned n collection points $C_1$ to $C_n$, and the center O1 of the optical identification region A1 is also staggered from the first light-transmitting hole $K_1$ and the second light-transmitting hole $K_2$ in each of the n hole groups.

FIG. 17 is a schematic top view of an optical identification region of another display panel according to some embodiments of the present disclosure. FIG. 18 is a schematic cross-sectional view along EE' shown in FIG. 17. Exemplarily, as shown in FIG. 17 and FIG. 18, the display panel includes a center collection point $C_0$, and a center hole group $KK_0$ corresponding to the center collection point $C_0$. The center hole group $KK_0$ includes a first light-transmitting hole $K_{10}$ located in the first layer 1 and a second light-transmitting hole $K_{20}$ located in the second layer 2. Exemplarily, an extension line of the main optical axis 40 of the lens 4 passes through the central collection point $C_0$. Along the direction perpendicular to the plane of the display panel, the center O1 of the optical identification region A1 overlaps with the first light-transmitting hole $K_{10}$ and the second light-transmitting hole $K_{20}$ in the center hole group $KK_0$. Exemplarily, an orthographic projection of the center of the first light-transmitting hole $K_{10}$ in the center hole group $KK_0$ on the plane of the display panel and an orthographic projection of the center of the second light-transmitting hole $K_{20}$ in the center hole group $KK_0$ on the plane of the display panel may coincide with the center O1 of the optical identification region A1.

In some embodiments, as shown in FIG. 17 and FIG. 18, an orthographic projection of the center of the first light-transmitting hole $K_{10}$ in the center hole group $KK_0$ on the plane of the display panel may coincide with an orthographic projection of the center of the second light-transmitting hole $K_{20}$ in the center hole group $KK_0$ on the plane of the display panel. The center hole group $KK_0$ can ensure that the light that is reflected at the center collection point $C_0$ and passes through the center O1 of the optical identification region A1 can successfully pass to reach the optical sensor 3.

It should be noted that it is only an example in FIGS. 3, 6, 8, 9, and 11-17 that an orthographic projection of the first light-transmitting hole $K_1$ on the plane of the display panel and an orthographic projection of the second light-transmitting hole $K_2$ on the plane of the display panel have an ellipse shape. In the embodiments of the present disclosure, a shape of the orthographic projection of the first light-transmitting hole $K_1$ on the plane of the display panel can be the same as or different from a shape of the orthographic projection of the second light-transmitting hole $K_2$ on the plane of the display panel. For example, in some embodiments of the present disclosure, at least one of the shapes of the orthographic projections can be a polygon shape or other irregular shape, which is not limited in the embodiments of the present disclosure.

Figure 19:
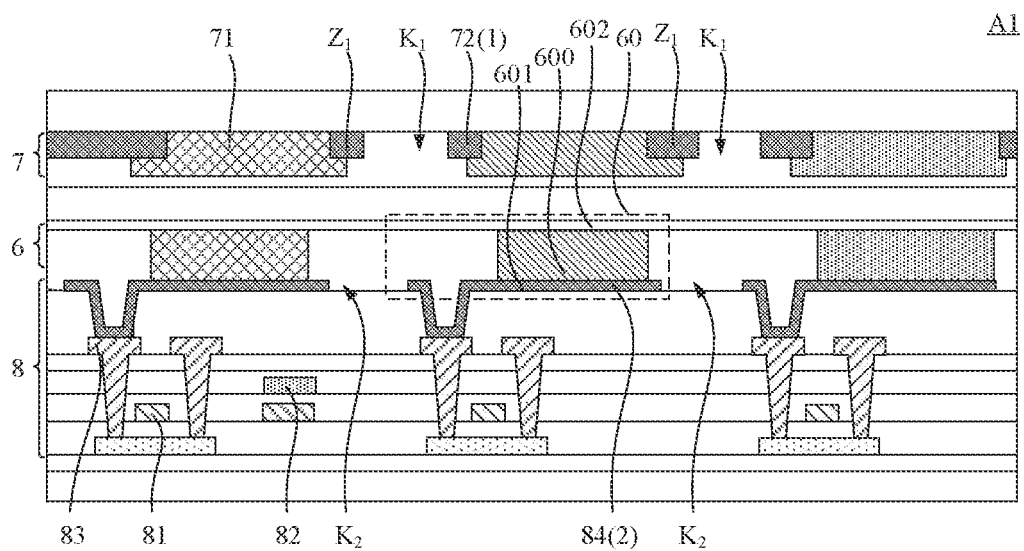
FIG. 19 is a schematic cross-sectional view of an optical identification region of another display panel according to some embodiments of the present disclosure.

FIG. 19 is a schematic cross-sectional view of an optical identification region of another display panel according to some embodiments of the present disclosure. Exemplarily, as shown in FIG. 19, the display panel further includes a display layer 6. The display layer 6 includes at least one layer of the layers of at least one light-emitting element 60. In some embodiments of the present disclosure, the light-emitting element 60 includes at least one of an organic light-emitting diode, a micro light-emitting diode, or a quantum dot light-emitting diode. Exemplarily, as shown in FIG. 19, the light-emitting element 60 includes a first electrode 601, a light-emitting layer 600, and a second electrode 602 that are stacked. In some embodiments of the present disclosure, the light-emitting element 60 can be used as a light source for optical identification.

Exemplarily, as shown in FIG. 19, the display panel includes a color filter layer 7 and an array layer 8. The color filter layer 7 is located at a side of the display layer 6 close to the light-exiting side of the display panel. The color filter layer 7 includes at least one color resist 71. The color resist 71 at least partially overlaps with the light-emitting spectrum of the corresponding light-emitting element 60. In some embodiments of the present disclosure, the color resist 71 and light-emitting element 60 have a same color. In some embodiments, the light-emitting element 60 can have a composite color including multiple colors, such as white, and the color resist 71 can have a color selected from red, green, and blue. In some embodiments of the present disclosure, the color filter layer 7 includes a black matrix 72 located between two adjacent color resists. The color filter layer 7 can be used to realize full-color display of the display panel and reduce the reflectivity of the display panel.

In some embodiments of the present disclosure, the color filter layer 7 includes the first layer 1. Exemplarily, the first light-transmitting hole $K_1$ can be formed in the color resist 71 and/or the black matrix 72 of the color filter layer 7. The color resist 71 and/or the black matrix 72 around the first light-transmitting hole $K_1$ includes the first light-shielding region $Z_1$. FIG. 19 illustrates a case in which the first light-transmitting hole $K_1$ is formed in the black matrix 72. Exemplarily, along the direction perpendicular to the plane of the display panel, the first light-transmitting hole $K_1$ do not overlap with the light-emitting layer 600 of the light-emitting element 60.

Exemplarily, as shown in FIG. 19, the display panel includes an array layer 8, and a pixel driving circuit and/or wiring are formed in the array layer 8. The pixel driving circuit includes multiple thin film transistors and storage capacitors. The pixel driving circuit is electrically connected to the light-emitting element 60. Exemplarily, the wiring includes at least one of a scanning line, a data line, a power line, and the like.

In some embodiments of the present disclosure, the array layer 8 includes multiple metal layers and an insulating layer that are stacked. As shown in FIG. 19, the array layer 8 includes a first metal layer 81, a second metal layer 82, a third metal layer 83, and a fourth metal layer 84. A gate and the scan line of the thin film transistor are formed in the first metal layer 81. An electrode plate of the storage capacitor and/or a reset signal line are formed in the second metal layer 82. A source and a drain of the thin film transistor and the data line are formed in the third metal layer 83. A first electrode 601 of the light-emitting element 60 is formed in the fourth metal layer 84.

Exemplarily, the array layer 8 includes the second layer 2. That is, the second light-transmitting hole $K_2$ can be formed in at least one layer of the layers of the array layer 8. Exemplarily, as shown in FIG. 19, the fourth metal layer 84 in the array layer 8 is reused as the second layer 2, that is, the second light-transmitting hole $K_2$ is formed in the fourth metal layer 84. Exemplarily, along the direction perpendicular to the plane of the display panel, the second light-transmitting hole $K_2$ does not overlap with the light-emitting layer 600 of the light-emitting element 60.

In some embodiments of the present disclosure, each second light-transmitting hole $K_2$ formed in the array layer 8 have a same area. Such configuration is beneficial to improving the structural consistency of the pixel driving circuit at different positions, thereby being beneficial to improving the consistency of the corresponding electrical signals transmitted by the pixel driving circuit and improving the display uniformity.

Exemplarily, in some embodiments of the present disclosure, the second light-transmitting holes $K_2$ formed in the array layer 8 may have different areas. For example, along the direction from the center O1 of the optical identification region A1 to the edge S, the area of each second light-transmitting hole $K_2$, increases, so that the second light-transmitting hole $K_2$ near the center O1 of the optical identification region A1 has a smaller area. In this way, it can ensure that the light reflected at the corresponding collection point can successfully pass, and more space can be reserved for other metal wiring.

Figure 20:
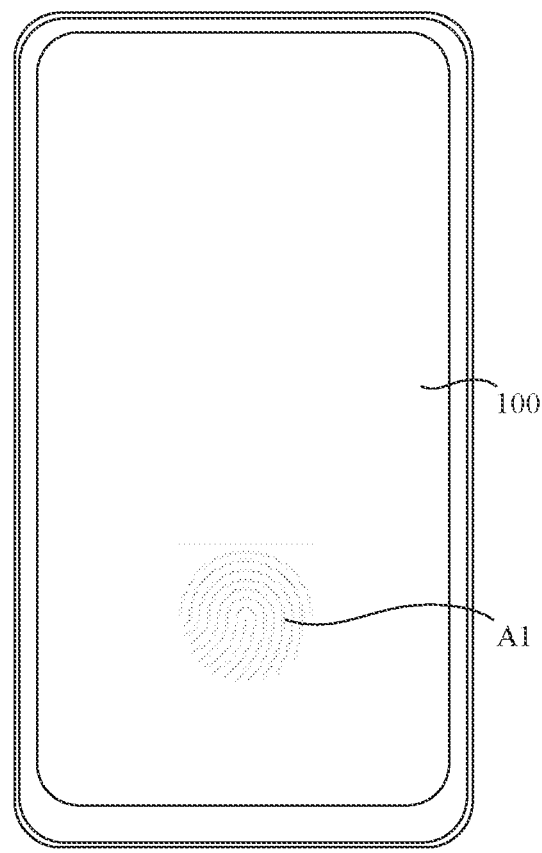
FIG. 20 is a schematic top view of a display device according to some embodiments of the present disclosure.
Figure 21:
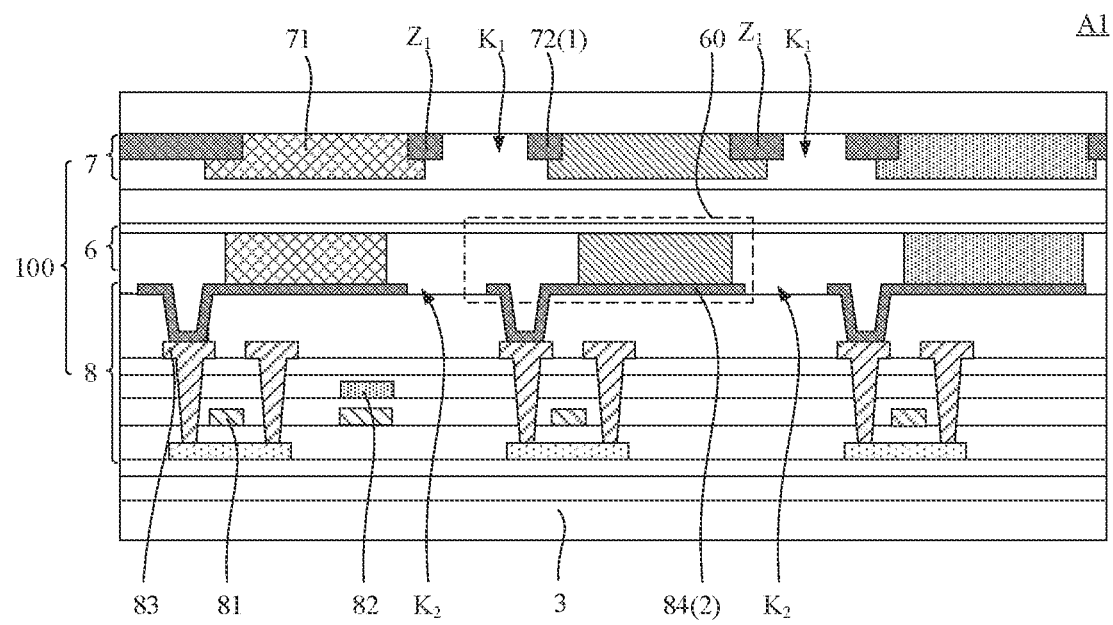
FIG. 21 is a schematic cross-sectional view of a display device according to some embodiments of the present disclosure.

Some embodiments of the present disclosure provide a display device. FIG. 20 is a schematic top view of a display device according to some embodiments of the present disclosure. FIG. 21 is a schematic cross-sectional view of a display device according to some embodiments of the present disclosure. As shown in FIG. 20 and FIG. 21, the display device includes the display panel 100 described above. A structure of the display panel 100 has been described in detail in the foregoing embodiments, and will not be repeated herein. It should be noted that, the display device shown in FIG. 20 is merely illustrative, and the display device can be any electronic device having a display function, such as a mobile phone, a tablet computer, a notebook computer, an electronic paper book, or a television.

As shown in FIG. 21, the display device includes an optical identification sensor 3. Exemplarily, the optical identification sensor 3 includes a finger identification sensor. The optical identification sensor 3 is located at a side of the display panel 100 away from the light-exiting side (of the display device).

In the display device provided by the embodiments of the present disclosure, by forming the first light-transmitting hole $K_1$ and the second light-transmitting hole $K_2$ in the first layer 1 and the second layer 2 of the display panel, respectively, optical identification can be realized at a side of the display panel 100 away from the light-exiting side (of the display device). That is, optical identification under the screen can be used. The display device with such a configuration does not need to reserve space at the light-emitting surface for providing a physical button, so that a full-screen design can be realized. That is, the display region of the display panel can be basically extended to the entire surface of the display panel.

In the embodiments of the present disclosure, the second light-transmitting hole $K_2$ at least partially overlaps with the first light-shielding region $Z_1$ in the first layer 1 along the direction perpendicular to the plane of the display panel, so that the large-angle reflected light that passes through the first light-transmitting hole $K_1$ can successfully pass through the second light-transmitting hole $K_2$ in the second layer 2 to reach the optical sensor 3, thereby being beneficial to increasing the light intensity of the large-angle reflected light received by the optical sensor 3, thus improving the identification accuracy of the optical sensor 3.

The above embodiments are merely some embodiments of the present disclosure and are not intended to limit the present disclosure. Any modifications, equivalent substitutions, and improvements made within the principle of the present disclosure shall fall into the scope of the present disclosure.

What is claimed is:

1. A display panel, having an optical identification region and comprising:
    a first layer;
    a second layer, the first layer being located at a side of the second layer close to a light-exiting side of the display panel; and
    a display layer below the first layer and above the second layer, wherein the display layer comprises light-emitting elements,
    wherein the first layer has at least one first light-shielding region and comprises at least one first light-transmitting hole, and the second layer comprises at least one second light-transmitting hole corresponding to the at least one first light-transmitting hole; and
    wherein one of the at least one first light-shielding region and one of the at least one second light-transmitting hole at least partially overlap with each other along a direction perpendicular to a plane of the display panel, so that large-angle reflected light that passes through one first light-transmitting hole corresponding to the one first light-shielding region successfully propagates towards an optical sensor after passing through the one second light-transmitting hole in the second layer.

2. The display panel according to claim 1, wherein the at least one first light-shielding region is adjacent to the at least one first light-transmitting hole; and one first light-shielding region of the at least one first light-shielding region is located at a side, close to a center of the optical identification region, of one of the at least one first light-transmitting hole that corresponds to one of the at least one second light-transmitting hole that corresponds to the one first light-shielding region.

3. The display panel according to claim 1, further comprising:
at least one lens located at a side of the second layer away from the first layer and located in the optical identification region.

4. The display panel according to claim 1, wherein one of the at least one first light-transmitting hole and one of the at least one second light-transmitting hole at least partially overlap with each other along the direction perpendicular to the plane of the display panel.

5. The display panel according to claim 4, further comprising:
a collection point located at a touch surface; and
a first substrate located at a side of the second layer away from the first layer,
wherein one first light-transmitting hole of the at least one first light-transmitting hole has a first end away from an edge of the optical identification region, and one second light-transmitting hole of the at least one second light-transmitting hole has a second end away from the edge of the optical identification region, and
wherein along a first direction parallel to the plane of the display panel, a distance $\Delta d_L$ between the first end and the second end satisfies: $\Delta d_L \geq \tan\theta_1 \times h_1$, where $\theta_1$ denotes an incident angle at which first light is irradiated on a surface of the first substrate close to the second layer, the first light being light that is incident to the first light-transmitting hole and the second light-transmitting hole after being reflected by the collection point; and hi denotes a distance between the first light-transmitting hole and the second light-transmitting hole along a second direction perpendicular to the first direction.

6. The display panel according to claim 4, further comprising:
a collection point located at a touch surface,
wherein one first light-transmitting hole of the at least one first light-transmitting hole comprises a first end away from an edge of the optical identification region, and one second light-transmitting hole of the at least one second light-transmitting hole comprises a second end away from the edge of the optical identification region; and each of a $1^{st}$ hole group through an nth hole group is formed by one of the at least one first light-transmitting hole and one of the at least one second light-transmitting hole that corresponds to the one of the at least one first light-transmitting hole;
wherein in the $n^{th}$ hole group, along a first direction parallel to the plane of the display panel, a distance between the first end and the second end is $\Delta d_{Ln}$;
wherein along a direction from a center of the optical identification region to an edge of the optical identification region, the $1^{st}$ hole group through the $n^{th}$ hole group are arranged in sequence; and
wherein $\Delta d_{La} < \Delta d_{Lb}$, where both a and b are positive integers selected from 1 to n, and a<b; or, wherein $\Delta d_{La} = \Delta d_{Lb}$, where both a and b are positive integers selected from 1 to n, and a<b.

7. The display panel according to claim 6, wherein, when $\Delta d_{La} = \Delta d_{Lb}$, b=n.

8. The display panel according to claim 6, further comprising:
a first substrate located at a side of the second layer away from the first layer, wherein $\Delta d_n \geq \tan\theta_1 \times h_1$, where $\theta_1$ denotes an incident angle at which light is irradiated on a surface of the first substrate close to the second layer after the light is reflected at the collection point, and $h_1$ denotes a distance between the first light-transmitting hole and the second light-transmitting hole along a second direction perpendicular to the first direction.

9. The display panel according to claim 1, wherein the at least one first light-transmitting hole and the at least one second light-transmitting hole do not overlap with each other along the direction perpendicular to the plane of the display panel.

10. The display panel according to claim 9, further comprising:
a collection point located at a touch surface; and
a first substrate located at a side of the second layer away from the first layer,
wherein one first light-transmitting hole of the at least one first light-transmitting hole comprises a first end away from an edge of the optical identification region, and one second light-transmitting hole of the at least one second light-transmitting hole comprises a second end close to the edge of the optical identification region, and
wherein along a first direction parallel to the plane of the display panel, a distance $\Delta d_W$ between the first end and the second end satisfies: $0 < \Delta d_W \leq \tan\theta_1 \times h_1$, where $\theta_1$ denotes an incident angle at which first light is irradiated on a surface of the first substrate close to the second layer, the first light being light that is incident to the first light-transmitting hole and the second light-transmitting hole after being reflected by the collection point; and $h_1$ denotes a distance between the first light-transmitting hole and the second light-transmitting hole along a second direction perpendicular to the first direction.

11. The display panel according to claim 9, further comprising:
a collection point located at a touch surface,
wherein one first light-transmitting hole of the at least one first light-transmitting hole comprises a first end away from an edge of the optical identification region, and one second light-transmitting hole of the at least one second light-transmitting hole comprises a second end close to the edge of the optical identification region; and each of a $1^{st}$ hole group through an $n^{th}$ hole group is formed by one of the at least one first light-transmitting hole and one of the at least one second light-transmitting hole corresponding to the one of the at least one first light-transmitting hole;
wherein in the $n^{th}$ hole group, along a first direction parallel to the plane of the display panel, a distance between the first end and the second end is $\Delta d_{Wn}$;
wherein along a direction from a center of the optical identification region to an edge of the optical identification region, the 1$^{st}$ hole group through the n$^{th}$ hole group are arranged in sequence; and wherein $\Delta d_{Wa} < \Delta d_{Wb}$, where both a and b are positive integers selected from 1 to n, and a<b; or wherein $\Delta d_{Wa} = \Delta d_{Wb}$, where both a and b are positive integers selected from 1 to n, and a<b.

12. The display panel according to claim 11, wherein when $\Delta d_{Wa} = \Delta d_{Wb}$, b=n.

13. The display panel according to claim 11, further comprising:
a first substrate located at a side of the second layer away from the first layer, wherein $0 < \Delta d_n \leq \tan \theta_1 \times h_1$, where $\theta_1$ denotes an incident angle at which light is irradiated on a surface of the first substrate facing towards the second layer after the light is reflected at the collection point; and hi denotes a distance between the first light-transmitting hole and the second light-transmitting hole along a second direction perpendicular to the first direction.

14. The display panel according to claim 1, wherein each of a 1$^{st}$ hole group through an n$^{th}$ hole group is formed by one of the at least one first light-transmitting hole and one of the at least one second light-transmitting hole corresponding to the one of the at least one first light-transmitting hole, and the 1$^{st}$ hole group through the n$^{th}$ hole group are arranged in sequence along a direction from a center of the optical identification region to an edge of the optical identification region; and
wherein an area of one of the at least one second light-transmitting hole in a p$^{th}$ hole group of the 1$^{st}$ hole group through the n$^{th}$ hole group is smaller than an area of another one of the at least one second light-transmitting hole in a q$^{th}$ hole group of the 1$^{st}$ hole group through the n$^{th}$ hole group, where both p and q are positive integers selected from 1 to n, and p<q.

15. The display panel according to claim 1, wherein each of a 1$^{st}$ hole group to an n$^{th}$ hole group is formed by one of the at least one first light-transmitting hole and one of the at least one second light-transmitting hole corresponding to the one of the at least one first light-transmitting hole, and the 1$^{st}$ hole group to the n$^{th}$ hole group are arranged in sequence along a direction from a center of the optical identification region to an edge of the optical identification region; and
wherein an area of one of the at least one second light-transmitting hole in an i$^{th}$ hole group of the 1$^{st}$ hole group to the n$^{th}$ hole group is equal to an area of another one of the second light-transmitting hole in a j$^{th}$ hole group of the 1$^{st}$ hole group to the n$^{th}$ hole group, where both i and j are positive integers selected from 1 to n, and i<j.

16. The display panel according to claim 1, wherein, along the direction perpendicular to the plane of the display panel, an orthographic projection of a center of one of the at least one first light-transmitting hole on the plane of the display panel coincides with an orthographic projection of a center of one of the at least one second light-transmitting hole on the plane of the display panel.

17. The display panel according to claim 1, wherein along the direction perpendicular to the plane of the display panel, an orthographic projection of an edge of one of the at least one first light-transmitting hole on the plane of the display panel coincides with an orthographic projection of an edge of one of the at least one second light-transmitting hole on the plane of the display panel.

18. A display device, comprising a display panel according to the claim 1.

19. A display panel, having an optical identification region and comprising:
a first layer;
a second layer, the first layer being located at a side of the second layer close to a light-exiting side of the display panel,
wherein the first layer has at least one first light-shielding region and comprises at least one first light-transmitting hole, and the second layer comprises at least one second light-transmitting hole corresponding to the at least one first light-transmitting hole;
wherein one of the at least one first light-shielding region and one of the at least one second light-transmitting hole at least partially overlap with each other along a direction perpendicular to a plane of the display panel;
wherein the display panel further comprises at least one of a color filter layer or an array layer; and
wherein the color filter layer comprises the first layer, and the array layer comprises the second layer.

20. A display panel, having an optical identification region and comprising:
a first layer;
a second layer, the first layer being located at a side of the second layer close to a light-exiting side of the display panel; and
a display layer below the first layer and above the second layer, wherein the display layer comprises light-emitting elements;
wherein the first layer has at least one first light-shielding region and comprises at least one first light-transmitting hole, and one of the at least one first light-shielding region surrounds one of the at least one first light-transmitting hole;
wherein the second layer comprises at least one second light-transmitting hole corresponding to the at least one first light-transmitting hole; and
wherein one of the at least one first light-shielding region surrounding one first light-transmitting hole and one of the at least one second light-transmitting hole corresponding to the same first light-transmitting hole at least partially overlap with each other along a direction perpendicular to a plane of the display panel, so that large-angle reflected light that passes through the one first light-transmitting hole successfully propagates towards an optical sensor after passing through the one second light-transmitting hole in the second layer.

* * * * *